United States Patent
Suzuki et al.

(10) Patent No.: US 8,014,191 B2
(45) Date of Patent: Sep. 6, 2011

(54) SEMICONDUCTOR MEMORY

(75) Inventors: Toshikazu Suzuki, Hyogo (JP);
Yoshinobu Yamagami, Kyoto (JP);
Satoshi Ishikura, Osaka (JP)

(73) Assignee: Panasonic Corporation, Osaka (JP)

( * ) Notice: Subject to any disclaimer, the term of this patent is extended or adjusted under 35 U.S.C. 154(b) by 314 days.

(21) Appl. No.: 12/352,838

(22) Filed: Jan. 13, 2009

(65) Prior Publication Data

US 2009/0161412 A1 Jun. 25, 2009

Related U.S. Application Data

(62) Division of application No. 11/637,691, filed on Dec. 13, 2006, now Pat. No. 7,495,948.

(30) Foreign Application Priority Data

Dec. 19, 2005 (JP) .................................. 2005-365102
May 31, 2006 (JP) .................................. 2006-151542

(51) Int. Cl.
*G11C 11/00* (2006.01)

(52) U.S. Cl. ............... 365/154; 365/189.04; 365/230.05; 365/226

(58) Field of Classification Search ................... 365/154, 365/185.05, 185.07, 189.04, 230.05
See application file for complete search history.

(56) References Cited

U.S. PATENT DOCUMENTS

| 7,345,919 | B2 * | 3/2008 | Honda et al. ............. 365/185.18 |
| 7,391,667 | B2 * | 6/2008 | Atwood et al. ................ 365/229 |
| 7,495,948 | B2 * | 2/2009 | Suzuki et al. ................. 365/154 |
| 7,869,263 | B2 * | 1/2011 | Lih et al. ....................... 365/154 |
| 2004/0141362 | A1 | 7/2004 | Sumitani et al. | |
| 2005/0013160 | A1 | 1/2005 | Higeta et al. | |

FOREIGN PATENT DOCUMENTS

JP 55-64686 A 5/1980

OTHER PUBLICATIONS

Y. Kagenishi et al. "Low Power Self Refresh Mode DRAM With Temperature Detecting Circuits", Memory Division, Matsushita Electronics, Corp. p. 43-44. Japan, Dec. 13, 2006.
K. Nii et al. "A 90nm Dual-Port SRAM with 2.04μ $m^2$ 8T-Thin Cell Using Dynamically-Controlled Column Bias Scheme" IEEE International Solid-State Circuits Conference Digest of Technical Papers, p. 508-510, 2004, Feb. 18, 2004.

* cited by examiner

*Primary Examiner* — Pho M Luu
(74) *Attorney, Agent, or Firm* — McDermott Will & Emery LLP

(57) ABSTRACT

In a semiconductor memory including word lines and bit lines arranged in a matrix and a plurality of memory cells provided at intersections of the word lines and the bit lines, a bit line precharge circuit is provided for controlling the potential of a low-data holding power supply coupled to memory cells provided on a corresponding one of the bit lines. In a write operation, the bit line precharge circuit controls the potential of a low-data holding power supply of a memory cell corresponding to a selected bit line to be higher than the potential of a low-data holding power supply of a memory cell corresponding to an unselected bit line.

20 Claims, 15 Drawing Sheets

FIG. 3

READ OPERATION

|  | Selected column / Selected WL | Selected column / Unselected WL | Unselected column / Selected WL | Unselected column / Unselected WL |
|---|---|---|---|---|
| VDD | 1.0V | 1.0V | 1.0V | 1.0V |
| VDD+α | 1.1V | 1.1V | 1.1V | 1.1V |
| β | 0.0V | 0.0V | 0.0V | 0.0V |
| WL | 1.0V | 0.0V | 1.0V | 0.0V |
| VBL | 0.8V | 0.8V | 0.8V | 0.8V |
| VBLX | 0.8V | 0.8V | 0.8V | 0.8V |

WRITE OPERATION

|  | Selected column / Selected WL | Selected column / Unselected WL | Unselected column / Selected WL | Unselected column / Unselected WL |
|---|---|---|---|---|
| VDD | 1.0V | 1.0V | 1.0V | 1.0V |
| VDD+α | 1.1V | 1.1V | 1.1V | 1.1V |
| β | 0.1V-0.3V | 0.1V-0.3V | 0.0V | 0.0V |
| WL | 1.0V | 0V | 1.0V | 0V |
| VBL | 0.8V | 0.8V | 0.8V | 0.8V |
| VBLX | 0.0V | 0.0V | 0.8V | 0.8V |

FIG. 6

SIMULTANEOUS READ AND WRITE OPERATIONS

| | | Selected column | | Unselected column | | Unselected column | |
|---|---|---|---|---|---|---|---|
| | | Selected WL | Unselected WL | Selected WL | Unselected WL | Selected WL | Unselected WL |
| VDD | | 1.0V | 1.0V | 1.0V | 1.0V | 1.0V | 1.0V |
| VDD+α (VDDM) | | 1.1V | 1.1V | 1.1V | 1.1V | 1.1V | 1.1V |
| β1/β2 | DIN = High level | 0.1-0.3V/0.0V | 0.1-0.3V/0.0V | 0.0V/0.0V | 0.0V/0.0V | 0.0V/0.0V | 0.0V/0.0V |
| | DINX = High level | 0.0V/0.1-0.3V | 0.0V/0.1-0.3V | 0.0V/0.0V | 0.0V/0.0V | 0.0V/0.0V | 0.0V/0.0V |
| β3 | | 0.0V | 0.0V | 0.0V | 0.0V | 0.0V | 0.0V |
| VWL | | VDD | 0.0V | 0.0V | VDD | 0.0V | 0.0V |
| RWL | | VDDM | 0.0V | 0.0V | VDDM | 0.0V | 0.0V |
| WBL/WBLX | DIN = High level | 0.8V/0.0V | 0.8V/0.0V | 0.8V/0.0V | 0.8V/0.0V | 0.8V/0.8V | 0.8V/0.8V |
| | DINX = High level | 0.0V/0.8V | 0.0V/0.8V | 0.0V/0.8V | 0.0V/0.8V | 0.8V/0.8V | 0.8V/0.8V |
| RBL | | VDD | 0.0V | 0.0V | VDD | 0.0V | 0.0V |

FIG. 12

SIMULTANEOUS READ AND WRITE OPERATIONS (High Temperature (>27°C))

|  |  | Selected column | | Unselected column | |
|---|---|---|---|---|---|
|  |  | Selected WL | Unselected WL | Selected WL | Unselected WL |
| VDD |  | 1.0V | 1.0V | 1.0V | 1.0V |
| VDD+α (VDDM) |  | 1.1V | 1.1V | 1.1V | 1.1V |
| β1/β2 | DIN = High level | 0.2V/0.0V | 0.2V/0.0V | 0.0V/0.0V | 0.0V/0.0V |
|  | DINX = High level | 0.0V/0.2V | 0.0V/0.2V | 0.0V/0.0V | 0.0V/0.0V |
| β3 |  | 0.0V | 0.0V | 0.0V | 0.0V |
| WWL |  | VDD | 0.0V | VDD | 0.0V |
| RWL |  | VDD | 0.0V | VDD | 0.0V |
| WBL/WBLX | DIN = High level | 0.8V/0.0V | 0.8V/0.0V | 0.8V/0.8V | 0.8V/0.8V |
|  | DINX = High level | 0.0V/0.8V | 0.0V/0.8V | 0.8V/0.8V | 0.8V/0.8V |
| RBL |  | VDD | VDD | 0.0V | 0.0V |

SIMULTANEOUS READ AND WRITE OPERATIONS (Low Temperature (27°C≧))

|  |  | Selected column | | Unselected column | |
|---|---|---|---|---|---|
|  |  | Selected WL | Unselected WL | Selected WL | Unselected WL |
| VDD |  | 1.1V | 1.1V | 1.1V | 1.1V |
| VDD+α (VDDM) |  | 1.0V | 1.0V | 1.0V | 1.0V |
| β1/β2 | DIN = High level | 0.3V/0.0V | 0.3V/0.0V | 0.0V/0.0V | 0.0V/0.0V |
|  | DINX = High level | 0.0V/0.3V | 0.0V/0.3V | 0.0V/0.0V | 0.0V/0.0V |
| β3 |  | 0.0V | 0.0V | 0.0V | 0.0V |
| WWL |  | VDD | 0.0V | VDD | 0.0V |
| RWL |  | VDD | 0.0V | VDD | 0.0V |
| WBL/WBLX | DIN = High level | 0.8V/0.0V | 0.8V/0.0V | 0.8V/0.8V | 0.8V/0.8V |
|  | DINX = High level | 0.0V/0.8V | 0.0V/0.8V | 0.8V/0.8V | 0.8V/0.8V |
| RBL |  | VDD | VDD | 0.0V | 0.0V |

FIG. 14

SIMULTANEOUS READ AND WRITE OPERATIONS (Low Supply Voltage (Vddz =1.0V (<1.2V)))

| | | Selected column | | Unselected column | |
|---|---|---|---|---|---|
| | | Selected WL | Unselected WL | Selected WL | Unselected WL |
| VDD | | 1.0V | 1.0V | 1.0V | 1.0V |
| VDDM | | 1.1V | 1.1V | 1.1V | 1.1V |
| β1/β2 | DIN = High level | 0.2V/0.0V | 0.2V/0.0V | 0.0V/0.0V | 0.0V/0.0V |
| | DINX = High level | 0.0V/0.2V | 0.0V/0.2V | 0.0V/0.0V | 0.0V/0.0V |
| β3 | | 0.0V | 0.0V | 0.0V | 0.0V |
| WWL | | VDD | VDD | VDD | VDD |
| RWL | | VDDM | 0.0V | VDDM | 0.0V |
| WBL/WBLX | DIN = High level | 0.8V/0.0V | 0.8V/0.0V | 0.8V/0.8V | 0.8V/0.8V |
| | DINX = High level | 0.0V/0.8V | 0.0V/0.8V | 0.8V/0.8V | 0.8V/0.8V |
| RBL | | VDD | 0.0V | VDD | 0.0V |

SIMULTANEOUS READ AND WRITE OPERATIONS (High Supply Voltage (Vddz =1.3V (≧1.2V)))

| | | Selected column | | Unselected column | |
|---|---|---|---|---|---|
| | | Selected WL | Unselected WL | Selected WL | Unselected WL |
| VDD | | 1.3V | 1.3V | 1.3V | 1.3V |
| VDDM | | 1.3V | 1.3V | 1.3V | 1.3V |
| β1/β2 | DIN = High level | 0.0V/0.0V | 0.0V/0.0V | 0.0V/0.0V | 0.0V/0.0V |
| | DINX = High level | 0.0V/0.0V | 0.0V/0.0V | 0.0V/0.0V | 0.0V/0.0V |
| β3 | | 0.0V | 0.0V | 0.0V | 0.0V |
| WWL | | VDD | VDD | VDD | VDD |
| RWL | | VDDM | 0.0V | VDDM | 0.0V |
| WBL/WBLX | DIN = High level | 0.8V/0.0V | 0.8V/0.0V | 0.8V/0.8V | 0.8V/0.8V |
| | DINX = High level | 0.0V/0.8V | 0.0V/0.8V | 0.8V/0.8V | 0.8V/0.8V |
| RBL | | VDD | 0.0V | VDD | 0.0V |

SEMICONDUCTOR MEMORY

CROSS-REFERENCE TO RELATED APPLICATIONS

This application is a Divisional of U.S. application Ser. No. 11/637,691, filed Dec. 13, 2006, now U.S. Pat. No. 7,495,948, which claims priority under 35 U.S.C. §119(a) on Japanese Patent Application No. 2005-365102 filed on Dec. 19, 2005 and Japanese Patent Application No. 2006-151542 filed on May 31, 2006, the entire contents of the specification, drawings and claims of which are hereby incorporated by reference.

BACKGROUND OF THE INVENTION

1. Field of the Invention

The present invention relates to a semiconductor memory including flip flop type memory cells and specifically to the technique of controlling the low-data holding power supply, high-data holding power supply, bit-line precharging power supply of the memory cells.

2. Description of the Prior Art

In recent years, along with the advancement of process miniaturization, the reduction in area of semiconductor integrated circuits and the decrease in supply voltage have been achieved on an accelerated basis. A disadvantage of these achievements is, for example, in the case of a semiconductor memory including flip flop type memory cells, such as a static random access memory (SRAM), a considerable difficulty in achieving stable memory cell characteristics due to variations in characteristics among transistors constituting memory cells or the decrease in supply voltage. As a result of this disadvantage, the yield of such a semiconductor memory undesirably decreases due to static noise margin (SNM) or deterioration in write characteristics.

FIG. 15 is a 1-port SRAM memory cell of a general flip flop type, which is formed by CMOS transistors. In FIG. 15, the memory cell includes drive transistors QN1 and QN2, access transistors QN3 and QN4, and load transistors QP1 and QP2. Reference numeral WL denotes a word line. Reference numerals BL and BLX denote bit lines. Reference numeral VDD denotes a power supply.

The load transistor QP1 and the drive transistor QN1 constitute an inverter. The load transistor QP2 and the drive transistor QN2 constitute another inverter. The input and output terminals of these inverters are cross-coupled to form a flip flop. Herein, the output terminal of each inverter is referred to as "data memory node". The power supply which is coupled to the sources of the load transistors QP1 and QP2 is referred to as "high-data holding power supply".

The gate terminals of the access transistors QN3 and QN4 are connected to the same word line WL. The drain terminal of the access transistor QN3 is connected to the bit line BL. The drain terminal of the access transistor QN4 is connected to the bit line BLX. The source terminals of the access transistors QN3 and QN4 are connected to the output terminals of the aforementioned inverters.

Writing of data in the SRAM memory cell of FIG. 15 is achieved by pulling the potential of one of the bit lines BL and BLX, which have been precharged to H (high) level, from H level to L (low) level while the word line WL is at H level (active state).

The memory cell characteristics of SRAM generally include the write level and the static noise margin.

The write level represents the write voltage to a memory cell. The operation of writing data in an SRAM memory cell is achieved by inverting the state of a flip flop included in the memory cell (provided, however, that when data identical to the write data is stored in the memory cell in advance, the state of the flip flop is not inverted). Herein, the critical potential of the bit line at which the state of the flip flop of the memory cell is invertible is referred to as "write level".

For example, when the write level is low, the margin for an erroneous writing due to bit line noise (static noise margin) becomes large in a write operation. However, the time required for the write operation becomes long because the flip flop cannot be inverted before the potential of the bit line reaches a sufficiently low level. On the other hand, when the write level is high, the margin for an erroneous writing (static noise margin) becomes small, although the time required for the write operation becomes short.

The write level being low means that the state of the flip flop of the memory cell unreadily inverts in the read operation due to bit line noise, or the like, i.e., that the static noise margin becomes large. The write level being high means that the state of the flip flop of the memory cell readily inverts in the read operation, i.e., that the static noise margin becomes small.

As described above, the write level and the static noise margin have conflicting characteristics with each other such that one of these characteristics cannot be satisfied without decreasing the other characteristic margin.

In view of such circumstances, there has been a proposal that at least one of these characteristics is ameliorated. For example, a semiconductor memory constructed with a view to improving only the write level has been known wherein the voltage of the high-data holding power supply of a memory cell is controlled so as to be low in a write operation, whereby the write level is ameliorated (see, for example, Japanese Laid-Open Patent Publication No. 55-64686).

On the other hand, the SRAM can be constructed in the form of a so-called 2-port SRAM wherein both write and read operations can be performed in one access. FIG. 16 shows a structure of a commonly-employed 2-port SRAM. This 2-port SRAM has a flip flop similar to that of the SRAM of FIG. 15 and further includes a pair of access transistors QN10 and QN11 which are connected to a data memory node of the flip flop, a word line WL2 for controlling the access transistors QN10 and QN11, and a pair of bit lines BL2 and BL2X (see, for example, 2004 IEEE International Solid-State Circuits Conference Digest of Technical Papers, pp. 508-510). The flip flop of the 2-port SRAM itself has the same structure as that of the 1-port SRAM, and therefore, the 2-port SRAM has the same characteristics for read and write operations as the 1-port SRAM.

However, in a semiconductor memory in which the voltage of the high-data holding power supply of the memory cell is controlled as described above, the writing level is ameliorated but, when the high-data holding power supply of the memory cell is controlled to have a low voltage, the static noise margin is deteriorated.

In a normal case, it is necessary for improving the static nose margin to set the potential of an activated word line lower than the high-data holding supply potential of the memory cell.

However, when the potential of the word line is decreased, the write level deteriorates on the other hand. Thus, even if the high-data holding supply voltage of the memory cell is decreased in a write operation such that the write level is ameliorated, the effect of such an arrangement is marred by a decrease in potential of the word line.

A normally-employed semiconductor memory has a matrix structure consisting of selected columns, unselected columns, selected word lines, and unselected word lines. Therefore, the word line potential cannot be selectively high or low only at a crossing point of a selected column and a selected word line.

However, when a word line is selected for a write operation, the static noise margin undesirably deteriorates (writing occurs) in memory cells of unselected columns present on the same selected word line even though it is not intended.

In the case of a 2-port SRAM, the following problems arise in addition to the above-described disadvantages of the 1-port SRAM.

In the 1-port SRAM, normally, either of read and write operations is performed in one access from one input-output circuit connected to a pair of bit lines to one memory cell. In the 2-port SRAM, on the other hand, a read or write operation can be simultaneously carried out on two memory cells through different input-output circuits connected to two pairs of bit lines. That is, there are two selected word lines and two selected column lines at the maximum for simultaneously accessing two memory cells. This enables the following operational procedures: different operations, i.e., read and write operations, simultaneously occur on two memory cells selected by different selected column lines on the same selected word line; or different operations, i.e., read and write operations, simultaneously occur on two memory cells selected by different selected word lines on the same selected column line.

Therefore, the conventional technique of ameliorating only the read margin (static noise margin) or write margin (write level) by the control of the word line level in the word line direction or the control of the high-data holding power supply in the column direction cannot comply with such a semiconductor memory as a 2-port SRAM wherein write and read operations for memory cells on the same selected line are simultaneously carried out.

SUMMARY OF THE INVENTION

The present invention was conceived in view of the above-described circumstances. An objective of the present invention is to provide a semiconductor memory including flip flop type memory cells, such as 1-port SRAM or 2-port SRAM in which read and write operations are simultaneously performed, wherein the static noise margin and the write level are simultaneously ameliorated.

To achieve the above objective, one embodiment of the present invention is a semiconductor memory, comprising:
   word lines and bit lines arranged in a matrix;
   a plurality of memory cells provided at intersections of the word lines and the bit lines; and
   a low-data holding power supply control circuit for controlling a potential of a low-data holding power supply coupled to memory cells provided on a corresponding one of the bit lines,
   wherein each of the plurality of memory cells has two cross-coupled inverter circuits for holding a pair of high data and low data, and
   the low-data holding power supply control circuit controls, in a write operation, a potential of a low-data holding power supply of a memory cell corresponding to a selected bit line to be higher than a potential of a low-data holding power supply of a memory cell corresponding to an unselected bit line.

One embodiment of the present invention is the aforementioned semiconductor memory, wherein:
   each of the two inverter circuits includes a low-data holding transistor and a high-data holding transistor which are connected in series; and
   a potential supplied to the high-data holding transistor is higher than a potential of a selected word line in read and write operations.

One embodiment of the present invention is the aforementioned semiconductor memory, further comprising a precharge circuit for precharging the bit lines such that a current flowing from the bit lines to the memory cells is small as compared with a case where the bit lines are precharged to a supply potential.

One embodiment of the present invention is the aforementioned semiconductor memory, wherein a difference between the precharge potential for the bit lines and a potential of a selected word line is equal to or smaller than a threshold voltage of transistors of the memory cells.

One embodiment of the present invention is the aforementioned semiconductor memory, wherein:
   each of the memory cells further includes a first read transistor and a second read transistor;
   the bit lines include read bit lines and write bit lines;
   the word lines include read word lines and write word lines;
   the first read transistor has a gate terminal connected to one of data memory nodes of the memory cell and a source terminal supplied with a potential of a low-data holding power supply or high-data holding power supply of the memory cell; and
   the second read transistor has a gate terminal connected to a read word line, a source terminal connected to a read bit line, and a drain terminal connected to a drain terminal of the first read transistor.

One embodiment of the present invention is the aforementioned semiconductor memory, wherein:
   each of the two inverter circuits includes a low-data holding transistor and a high-data holding transistor which are connected in series; and
   source terminals of the low-data holding transistors of the two inverter circuits are connected to different low-data holding power supplies.

One embodiment of the present invention is the aforementioned semiconductor memory, wherein source terminals of the low-data holding transistors of the two inverter circuits and a source terminal of the first read transistor are connected to different low-data holding power supplies.

One embodiment of the present invention is the aforementioned semiconductor memory, wherein the low-data holding power supplies connected to the source terminals of the low-data holding transistors of the two inverter circuits are controlled to have different potentials according to input data.

One embodiment of the present invention is the aforementioned semiconductor memory, wherein a potential of the read word line connected to the gate terminal of the second read transistor is higher than a potential of the write word line when the read word line is selected.

One embodiment of the present invention is the aforementioned semiconductor memory, wherein:
   the memory cell further includes an access transistor and is connected to one write bit line; and
   the access transistor has a source terminal connected to the data memory node, a gate terminal connected to a write word line, and a drain terminal connected to a write bit line.

One embodiment of the present invention is the aforementioned semiconductor memory, wherein the gate terminal of the first read transistor is connected to one of the data memory nodes of the memory cell which is different from the data memory node connected to the source terminal of the access transistor.

One embodiment of the present invention is the aforementioned semiconductor memory, wherein:

source terminals of the low-data holding transistors of the two inverter circuits are connected to different low-data holding power supplies; and a potential of a source terminal of a low-data holding transistor of one of the inverter circuits which corresponds to the data memory node connected to the access transistor is controlled, in a write operation, to be higher than a potential of a source terminal of a low-data holding transistor of the other inverter circuit when write data from a write bit line is at high level.

One embodiment of the present invention is the aforementioned semiconduct or memory, further comprising:

an access transistor which has a source terminal connected to the data memory node, a gate terminal connected to a write word line, and a drain terminal connected to a write bit line; and a control circuit for controlling the access transistor and the second read transistor as a write port and a read port, respectively, such that a read or write operation is simultaneously performed on a plurality of memory cells.

One embodiment of the present invention is the aforementioned semiconductor memory, wherein the first and second read transistors are formed by a diffusion layer having a linear shape, the diffusion layer being parallel to a diffusion layer of transistors of the inverter circuits.

One embodiment of the present invention is the aforementioned semiconductor memory, wherein the threshold value of the first and second read transistors is equal to that of a transistor of a logic circuit other than transistors used for the memory cells.

One embodiment of the present invention is the aforementioned semiconductor memory, further comprising an amplifier connected to the read bit line, wherein the amplifier is supplied with a source potential, and the supplied source potential is higher than potentials of power supplies of other logic circuits of the memory cells and than a ground potential.

One embodiment of the present invention is a semiconductor memory, comprising:

word lines and bit lines arranged in a matrix; and a plurality of memory cells provided at intersections of the word lines and the bit lines, wherein each of the plurality of memory cells has two cross-coupled inverter circuits for holding a pair of high data and low data, and a potential of the word lines is high when the temperature of the semiconductor memory is equal to or lower than a predetermined temperature which is within an operable-temperature range as compared with a case where the temperature of the semiconductor memory is higher than the predetermined temperature.

One embodiment of the present invention is a semiconductor memory, comprising:

word lines and bit lines arranged in a matrix; and a plurality of memory cells provided at intersections of the word lines and the bit lines, wherein each of the plurality of memory cells has two cross-coupled inverter circuits for holding a pair of high data and low data, and a potential of a high-data holding power supply coupled to the two inverter circuits is low when the temperature of the semiconductor memory is equal to or lower than a predetermined temperature which is within an operable-temperature range as compared with a case where the temperature of the semiconductor memory is higher than the predetermined temperature.

One embodiment of the present invention is a semiconductor memory, comprising:

word lines and bit lines arranged in a matrix; and a plurality of memory cells provided at intersections of the word lines and the bit lines, wherein each of the plurality of memory cells has two cross-coupled inverter circuits for holding a pair of high data and low data, and a potential of a low-data holding power supply coupled to the two inverter circuits in a write operation is high when the temperature of the semiconductor memory is equal to or lower than a predetermined temperature which is within an operable-temperature range as compared with a case where the temperature of the semiconductor memory is higher than the predetermined temperature.

One embodiment of the present invention is a semiconductor memory, comprising:

word lines and bit lines arranged in a matrix;

a plurality of memory cells provided at intersections of the word lines and the bit lines; and a low-data holding power supply control circuit for controlling a potential of a low-data holding power supply coupled to memory cells provided on a corresponding one of the bit lines, wherein each of the plurality of memory cells has two cross-coupled inverter circuits for holding a pair of high data and low data, and a potential of a low-data holding power supply of the memory cell corresponding to a selected bit line is high when the temperature of the semiconductor memory is equal to or lower than a predetermined temperature which is within an operable-temperature range as compared with a case where the temperature of the semiconductor memory is higher than the predetermined temperature.

One embodiment of the present invention is the aforementioned semiconduct or memory, wherein:

each of the two inverter circuits includes a low-data holding transistor and a high-data holding transistor which are connected in series;

source terminals of the low-data holding transistors of the two inverter circuits are connected to different low-data holding power supplies; and in a write operation, potentials supplied to the different low-data holding power supplies are high when the temperature of the semiconductor memory is equal to or lower than the predetermined temperature as compared with a case where the temperature of the semiconductor memory is higher than the predetermined temperature.

One embodiment of the present invention is the aforementioned semiconductor memory, wherein a potential of a low-data holding power supply of a memory cell corresponding to the selected bit line is low when the semiconductor memory operates at a voltage equal to or higher than a predetermined voltage which is within an operable-voltage range as compared with a case where the semiconductor memory operates at a voltage lower than the predetermined voltage.

One embodiment of the present invention is the aforementioned semiconductor memory, wherein a potential of a low-data holding power supply of a memory cell corresponding to the selected bit line is equal to a potential of a low-data holding power supply of a memory cell corresponding to the unselected bit line when the semiconductor memory operates at a voltage higher than the predetermined voltage.

One embodiment of the present invention is a semiconductor memory, comprising:

word lines and bit lines arranged in a matrix; and a plurality of memory cells provided at intersections of the word lines and the bit lines, wherein each of the plurality of memory cells has two cross-coupled inverter circuits for holding a pair of high data and low data, and a potential of a high-data holding power supply coupled to the two inverter circuits is low when the semiconductor memory operates at a voltage equal to or higher than a predetermined voltage which is within an operable-voltage range as compared with a case where the semiconductor memory operates at a voltage lower than the predetermined voltage.

One embodiment of the present invention is the aforementioned semiconductor memory, wherein a potential of a high data holding power supply is equal to a potential of the word lines when the semiconductor memory operates at a voltage higher than the predetermined voltage.

One embodiment of the present invention is the aforementioned semiconductor memory, wherein a potential supplied to the read word line is low when the semiconductor memory operates at a voltage equal to or higher than a predetermined voltage which is within an operable-voltage range as compared with a case where the semiconductor memory operates at a voltage lower than the predetermined voltage.

One embodiment of the present invention is the aforementioned semiconductor memory, wherein a potential supplied to the read word line is equal to a supply potential of a logic circuit other than the memory cells.

One embodiment of the present invention is the aforementioned semiconductor memory, wherein a threshold value of the first and second read transistors is lower than a threshold value of other transistors of the memory cell.

One embodiment of the present invention is the aforementioned semiconductor memory, wherein a potential of the read word line connected to the gate terminal of the second read transistor is equal to a potential of a high-data holding power supply of the memory cell when the read word line is selected.

One embodiment of the present invention is the aforementioned semiconductor memory, wherein:

each of the two inverter circuits includes a low-data holding transistor and a high-data holding transistor which are connected in series;

the memory cell has a write access transistor; and a current drivability of the write access transistor is greater than that of the low-data holding transistors of the two inverter circuits.

One embodiment of the present invention is the aforementioned semiconductor memory, wherein:

each of the two inverter circuits includes a low-data holding transistor and a high-data holding transistor which are connected in series;

the memory cell has a write access transistor; and a threshold value of the write access transistor is lower than that of the low-data holding transistors of the two inverter circuits.

One embodiment of the present invention is the aforementioned semiconductor memory, wherein:

each of the two inverter circuits includes a low-data holding transistor and a high-data holding transistor which are connected in series;

a threshold value of the first and second read transistors and a threshold value of one of the low-data holding transistors of the two inverter circuits which is adjacent to the first and second read transistors in view of a layout are lower than a threshold value of the other low-data holding transistor.

To ameliorate the noise static margin, a semiconductor memory of the present invention adopts the following measures:

(1) for an unselected column on a selected word line, to suppress the difference in potential between gate and source of an access transistor to which the word line is connected so as to be lower than the difference in potential between gate and source of a drive transistor of an inverter circuit of a memory cell while the difference between a potential of a high-data holding power supply and a potential of a low-data holding power supply is maintained equal to or higher than a supply potential; and (2) in the selection of a word line, to decrease the precharge level of a bit line such that the current injected to a memory cell is decreased.

A measure to ameliorate the write level is to control the potential of the low-data holding power supply rather than the potential of the high-data holding power supply.

Meanwhile, in the case of a 2-port SRAM, the following measure is employed, in addition to the above measures, when read and write operations on different memory cells are simultaneously performed, for the purpose of ameliorating both the static noise margin and the write level: a low-data holding power supply of a flip flop for storing data of a memory cell is separated from a ground power supply of a read bit line driver (read transistor) such that the potential of a low-data holding power supply of a column including a memory cell in which the write operation is performed is higher than the potential of the ground power supply of the read bit line driver.

A semiconductor memory according to the present invention employs the following measure in order to prevent deterioration in static noise margin which would occur due to the effects of temperature and supply potential.

To secure the static noise margin of a memory cell, the potential of a high-data holding power supply of the memory cell is low when the temperature of the semiconductor memory is equal to or lower than a predetermined temperature which is within an operable-temperature range as compared with a case where the temperature of the semiconductor memory is higher than the predetermined temperature. This further facilitates writing of data in the memory cell.

Further, the potential of the high-data holding power supply of the memory cell is low when the semiconductor memory operates at a voltage higher than a predetermined voltage which is within an operable-voltage range as compared with the case of a low supply voltage. With this measure, both the margins for reading and writing in the memory cell are secured, and the power consumed by the memory cell is decreased. Furthermore, the gate-source potential of a memory cell transistor is decreased to relax an electric field on an insulator film of the transistor, whereby the reliability of the semiconductor memory is improved.

BRIEF DESCRIPTION OF THE DRAWINGS

FIG. 3 describes the potentials at terminals in read and write operations in the semiconductor memory of embodiment 1.

FIG. 6 describes the potentials at terminals in read and write operations in the semiconductor memory of embodiment 2.

FIG. 12 describes the potentials at terminals in read and write operations in the semiconductor memory of embodiment 5.

FIG. 14 describes the potentials at terminals in read and write operations in the semiconductor memory of embodiment 6.

DESCRIPTION OF THE PREFERRED EMBODIMENTS

Figure 1:
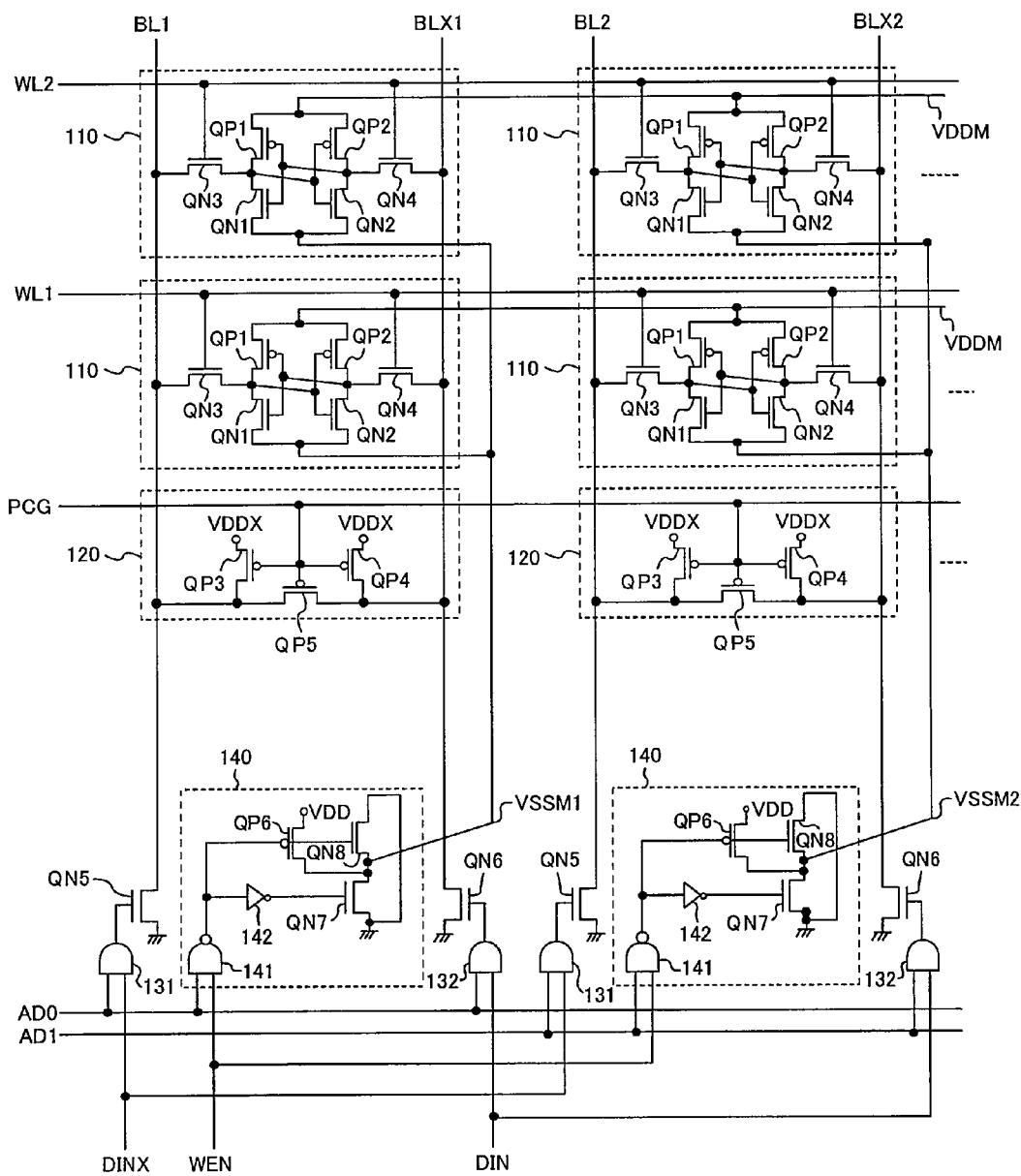
FIG. 1 is a block diagram showing the structure of a semiconductor memory according to embodiment 1.

Hereinafter, embodiments of the present invention will be described with reference to the drawings. In the following descriptions of the embodiments, components equivalent to those once described are denoted by the same reference numerals, and the descriptions thereof are omitted.

Embodiment 1

FIG. 1 is a block diagram showing the structure of a semiconductor memory 100 according to embodiment 1 of the present invention. It should be noted that, in FIG. 1, circuits for the reading system are omitted for simplicity of description.

Referring to FIG. 1, the semiconductor memory 100 includes memory cells 110, bit line precharge circuits 120, AND circuits 131 and 132, low-data holding power supply controlling circuits 140, and transistors QN5 and QN6 (N-type MOS transistors).

In FIG. 1, reference numerals WL1 and WL2 denote word lines. The word lines WL1 and WL2 extend in the row direction. The word lines WL1 and WL2 are connected to supply potential VDD when selected but connected to the ground when unselected.

Bit lines BL1, BL2, BLX1 and BLX2 extend in the column direction. Bit lines BL1 and BLX1 constitute a bit line pair, and bit lines BL2 and BLX2 constitute another bit line pair. One of each bit line pair (the pair of bit lines BL1 and BLX1 and the pair of bit lines BL2 and BLX2) is connected to the drain terminal of the transistor QN5. The other bit line is connected to the drain terminal of the transistor QN6.

Signal PCG is transmitted through a signal line extending in the row direction and used for controlling the bit line precharge circuits 120 (precharge control signal PCG). Precharge control signal PCG is at L level when the word lines are inactive (Low level: hereinafter, simply referred to as "L level"). Precharge control signal PCG is at H level when any word line is active (High level: hereinafter, simply referred to as "H level").

Signals AD0 and AD1 are column address signals. Input data DIN and DINX are complementary to each other. Signal WEN is an enable control signal. Reference numeral VDD denotes a power supply. Reference numeral VDDX denotes a power supply for the bit line precharge circuits 120. It should be noted that power supply VDDX has a potential lower than power supply VDD by several hundreds of millivolts (e.g., 300 mV).

The memory cells 110 are provided at intersections of the word lines (WL1 and WL2) and the bit line pairs on a one-to-one basis. The memory cells 110 arranged in such a matrix constitute a memory array section for storing information.

Figure 2:
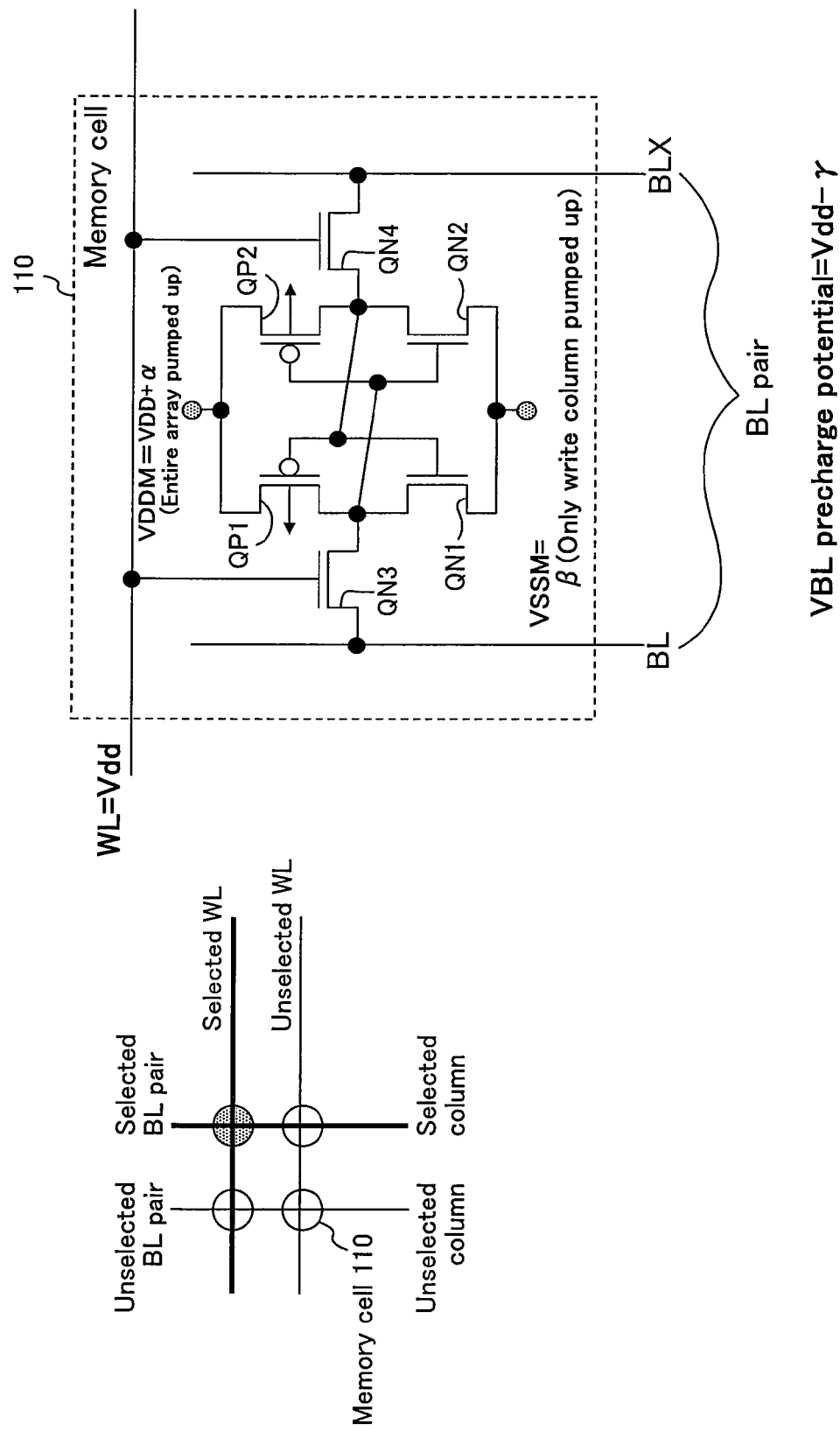
FIG. 2 shows an example of the structure of a 1-port memory cell.

Specifically as shown in FIG. 2, the memory cell 110 includes load transistors QP1 and QP2, drive transistors QN1 and QN2, and access transistors QN3 and QN4. In FIG. 2, reference numerals BL and BLX denote bit lines, which constitute a bit line pair.

In the memory cell 110, the load transistor QP1 and the drive transistor QN1 constitute an inverter. The load transistor QP2 and the drive transistor QN2 constitute another inverter. The input and output terminals of these inverters are cross-coupled to form a flip flop. With this arrangement, high data and low data ("data 0 and data 1" or "data 1 and data 0") can be held at the output terminals of the inverters. Herein, the output terminal of each inverter is referred to as "data memory node". The drive transistors QN1 and QN2 are referred to as "low-data holding transistors". The load transistors QP1 and QP2 are referred to as "high-data holding transistors".

The gate terminals of the access transistors QN3 and QN4 are connected to the same word line (WL1 or WL2). The drain terminal of the access transistor QN3 is connected to one bit line of the bit line pair. The drain terminal of the access transistor QN4 is connected to the other bit line. The source terminals of the access transistors QN3 and QN4 are connected to the output terminals of the inverters. The source terminals of the drive transistors QN1 and QN2 which constitute an inverter are connected to power supply VSSM1 or VSSM2. Herein, power supplies VSSM1 and VSSM2 are referred to as "memory cell low-data holding power supplies".

The source terminals of the load transistors QP1 and QP2 are connected to power supply VDDM. Herein, power supply VDDM is referred to as "memory cell high-data holding power supply".

The potential of the memory cell high-data holding power supply VDDM is set such that the difference between the potential of the power supply VDDM and the potential of a selected word line is smaller than the threshold voltage of the access transistors QN3 and QN4. Thus, for example, even when any word line is selected, high data held by the memory cell is protected from deterioration, and the power consumption is small. In this embodiment, specifically, the memory cell high-data holding power supply VDDM has a potential higher than that of power supply VDD by 0.1 V.

Specifically, each of the bit line precharge circuits 120 includes precharge transistors QP3 and QP4 and an equalizing transistor QP5. The bit line precharge circuits 120 are provided at intersections of the signal line for precharge control signal PCG and the bit line pairs on a one-to-one basis. Each transistor included in the bit line precharge circuits 120 is a P-type MOS transistor.

The gate terminal of each transistor of the bit line precharge circuits 120 is coupled to precharge control signal PCG. Each of the precharge transistors QP3 and QP4 has a source terminal connected to power supply VDDX and a drain terminal connected to the source and drain terminals of the equalizing transistor QP5. The drain terminal of the precharge transistor QP3 is connected to one bit line of the bit line pair. The drain terminal of the precharge transistor QP4 is connected to the other bit line.

When precharge control signal PCG is at L level, the bit line precharge circuit 120, which has the above-described structure, precharges a bit line connected to the bit line precharge circuit 120 to VDDX level. When precharge control signal PCG is at H level, all the P-type MOS transistors (QP3 to QP5) of the bit line precharge circuit 120 are off, resulting in a state ineffective to the bit line (high impedance state).

AND circuits 131 and 132 are provided to each column. The AND circuit 131 has an input terminal coupled to input data DINX and another input terminal coupled to a column address signal (AD0 or AD1). The output of the AND circuit 131 is connected to the gate terminal of the transistor QN5. The AND circuit 132 has an input terminal coupled to input data DIN and another input terminal coupled to a column address signal (AD0 or AD1). The output of the AND circuit 132 is connected to the gate terminal of the transistor QN6. In a selected column, the AND circuits 131 and 132 and the transistors QN5 and QN6 control the bit line pair according to write data such that one bit line of the bit line pair has a L-level potential.

Each column has one low-data holding power supply controlling circuit 140. The low-data holding power supply controlling circuit 140 provides memory cell low-data holding power supply VSSM1 (or VSSM2) to the memory cells 110 on the same bit line. Specifically, the low-data holding power supply controlling circuit 140 includes an NAND circuit 141, an NOT circuit 142, a P-type MOS transistor QP6, and N-type MOS transistors QN7 and QN8.

The NAND circuit 141 has an input terminal coupled to write enable control signal WEN and another input terminal coupled to a column address signal (AD0 or AD1). With this arrangement, in a selected column, the output of the NAND circuit 141 is at L level only when the column address signal is active (H level) and write enable control signal WEN is at H level (i.e., only when writing is performed in the selected column) but is at H level when otherwise.

The NOT circuit 142 inverts the output of the NAND circuit 141.

The P-type MOS transistor QP6 has a gate terminal coupled to the output of the NAND circuit 141 and a source terminal connected to power supply VDD.

The N-type MOS transistor QN7 has a gate terminal connected to the output of the NOT circuit 142 and a source terminal connected to the ground.

The N-type MOS transistor QN8 has a gate terminal connected to the output of the NAND circuit 141 and a source terminal connected to the ground. The drain terminal of the N-type MOS transistor QN8 is connected to the drain terminal of the N-type MOS transistor QN7. Memory cell low-data holding power supply (VSSM1 or VSSM2) is provided from the connection node between the drain terminals of the N-type MOS transistors QN7 and QN8.

In the low-data holding power supply controlling circuits 140 having the above structure, during a write operation in a selected column, the output of the NAND circuit 141 in the selected column is active, so that memory cell low-data holding power supply VSSM1 (or VSSM2) for the write operation, which is coupled to the connection node between the drain terminal of P-type MOS transistor QP6 and the drain terminal of N-type MOS transistor QN7, is 0.1 to 0.3 V. When no column is selected or during a read operation, power supply VSSM1 (or VSSM2) is connected to the ground potential by the N-type MOS transistor QN7.

A read operation performed in the above-described semiconductor memory 100 is now described.

Before the start of the read operation, precharge control signal PCG is at L level. Accordingly, the bit line precharge circuit 120 precharges a bit line to VDDX level which is lower than VDD level. Then, when the read operation is started, any word line becomes active (H level), and precharge control signal PCG also becomes H level, so that the bit line is set to VDDX level which is lower than VDD level.

In the selected column, the potential of memory cell low-data holding power supply is VSSM=β=0 V. The potential of memory cell high-data holding power supply is VDDM=VDD+α=VDD+0.1 V. Therefore, the potential difference between the gate and source of the drive transistor QN1 or QN2, {(VDD+α)−β}=VDD+0.1 V, is larger than the potential difference between the gate and source of the access transistor QN3 or QN4, (VDD−β)=(VDD−0 V).

Thus, the current capacity of the drive transistor is larger than that of the access transistor. That is, in a memory cell connected to a selected word line, even in the case of current injection from the bit line BL1 (or BL2) or bit line BLX1 (or BLX2) to a memory cell low power supply, the static noise margin of the memory cell is increased because the drive transistor (QN1 or QN2) which holds the potential of the memory cell low power supply has a large current capacity.

The same also occurs in an unselected memory cell. A memory cell which is on a selected word line but in an unselected column also has an increased static noise margin.

Since the precharge level of the bit line BL1 (or BL2) or bit line BLX1 (or BLX2) is VDDX which is lower than supply potential VDD, the current which is injected from a bit line to a low-side data memory node of a memory cell is decreased. Accordingly, such a dual effect increases the static noise margin.

The difference between the precharge level of the bit line BL1 (or BL2) or bit line BLX1 (or BLX2) and the level of the selected word line WL1 (or WL2) where WL=VDD is set smaller than the threshold voltage of the access transistors QN3 and QN4 of the memory cell (about 0.3 V), e.g., WL−VBL=0.2 V. Thus, current leakage from the node of the memory cell which holds high data to the bit line BL1 (or BL2) or bit line BLX1 (or BLX2) is suppressed.

When a write operation is performed, any word line becomes active (H level), and precharge control signal PCG also becomes H level. Accordingly, the bit line precharge circuit 120 precharges a bit line to VDDX level which is lower than VDD level.

The potential of the low-data holding power supply of a memory cell of a selected column is controlled by the low-data holding power supply controlling circuit 140 so as to be VSSM=β=0.1 to 0.3 V. With this, the inversion level of the memory cell is increased, so that the write operation is readily carried out.

FIG. 3 shows tables including the potentials at terminals in read and write operations in the semiconductor memory 100. The information are sorted according to the selection of columns (selected/unselected columns), the selection of word lines (selected/unselected word lines), and the operation mode (read/write operations). As seen from FIG. 3, the features of the semiconductor memory 100 are as follows:

(1) In the write operation, the potential of the memory cell low-data holding power supply VSSM of a selected column (=β) is 0.1 to 0.3 V, but potential β is 0 V in an unselected column and during the read operation;

(2) Irrespective of whether selected or unselected, the potential of the memory cell high-data holding power supply VDDM (=VDD+α) is 1.1 V, which is higher than the potential of the power supply used for selection of word lines (WL=VDD=1.0 V); and (3) The potential of bit line precharge power supply VDDX (=VBL/VBLX=0.8 V) is lower than the potential of power supply VDD used for precharging bit lines in a conventional SRAM (=1.0 V).

The present inventors conducted a simulation to confirm the effects of the present invention for amelioration of the static noise margin in the semiconductor memory 100. For example, we carried out a simulation with a memory cell of 65 nm CMOS process under the conditions that supply voltage VDD=1.0 V, the potential of the memory cell high-data holding power supply VDDM is VDD+0.1 V, the potential of memory cell low-data holding power supply VSSM is GND+ 0.3 V, and bit line precharge levels VBL and VBLX are 0.8 V, and confirmed that the static noise margin was about twice that of a conventional memory.

We also confirmed that, under the above condition of memory cell low-data holding power supply VSSM, the write level was improved by 70%.

As described above, according to this embodiment, the write level of a selected cell is increased during a write operation, so that writing is readily carried out. Further, the static noise margin of an unselected memory cell which is on a selected word line but in an unselected column is increased, so that data corruption can be avoided. In an unselected memory cell on a selected column, the word line is unselected, so that the static noise margin is not affected.

Also in a read operation, the static noise margin of a selected memory cell and the static noise margin of an unselected memory cell which is on a selected word line but in an unselected column can be increased.

Embodiment 2

In embodiment 2, applications of the present invention to a 2-port SRAM which has two ports and a multi-port SRAM which has more than two access ports are described.

These semiconductor memories are also basically formed by cross-coupling of inverters for holding a pair of high data and low data. Therefore, the control technique of embodiment 1 for the memory cell low-data holding power supply, etc., can be commonly used in embodiment 2.

Figure 4:
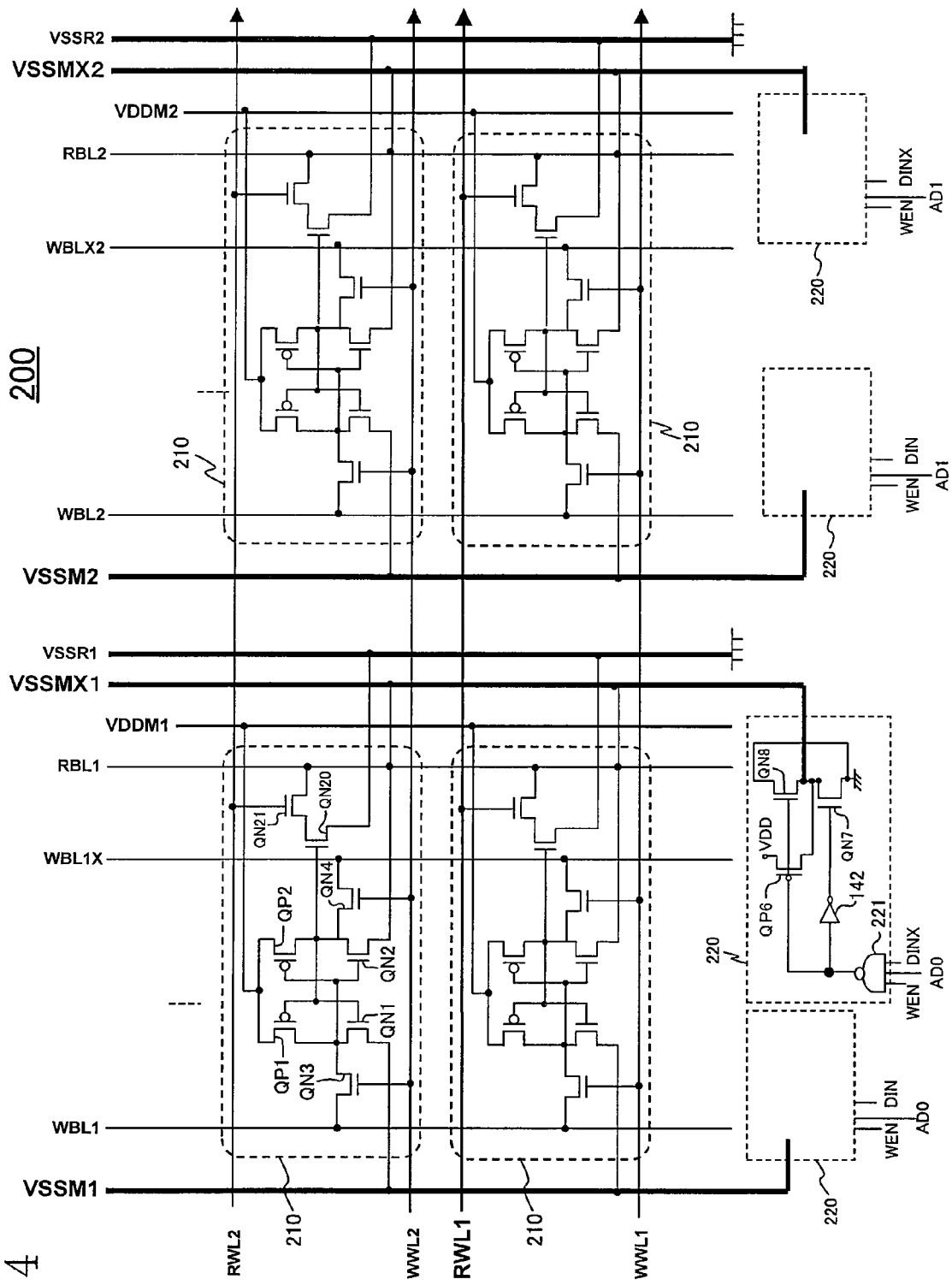
FIG. 4 is a block diagram showing the structure of a semiconductor memory according to embodiment 2.

FIG. 4 is a block diagram showing the structure of a semiconductor memory 200 according to embodiment 2 of the present invention.

The semiconductor memory 200 includes memory cells 210 and low-data holding power supply controlling circuits 220 in place of the memory cells 110 and the low-data holding power supply controlling circuits 140 of the semiconductor memory 100. The semiconductor memory 200 further includes bit line precharge circuits 120, AND circuits 131 and 132, and transistors QN5 and QN6 as does the semiconductor memory 100, but illustration of these elements is omitted from FIG. 4.

Figure 5:
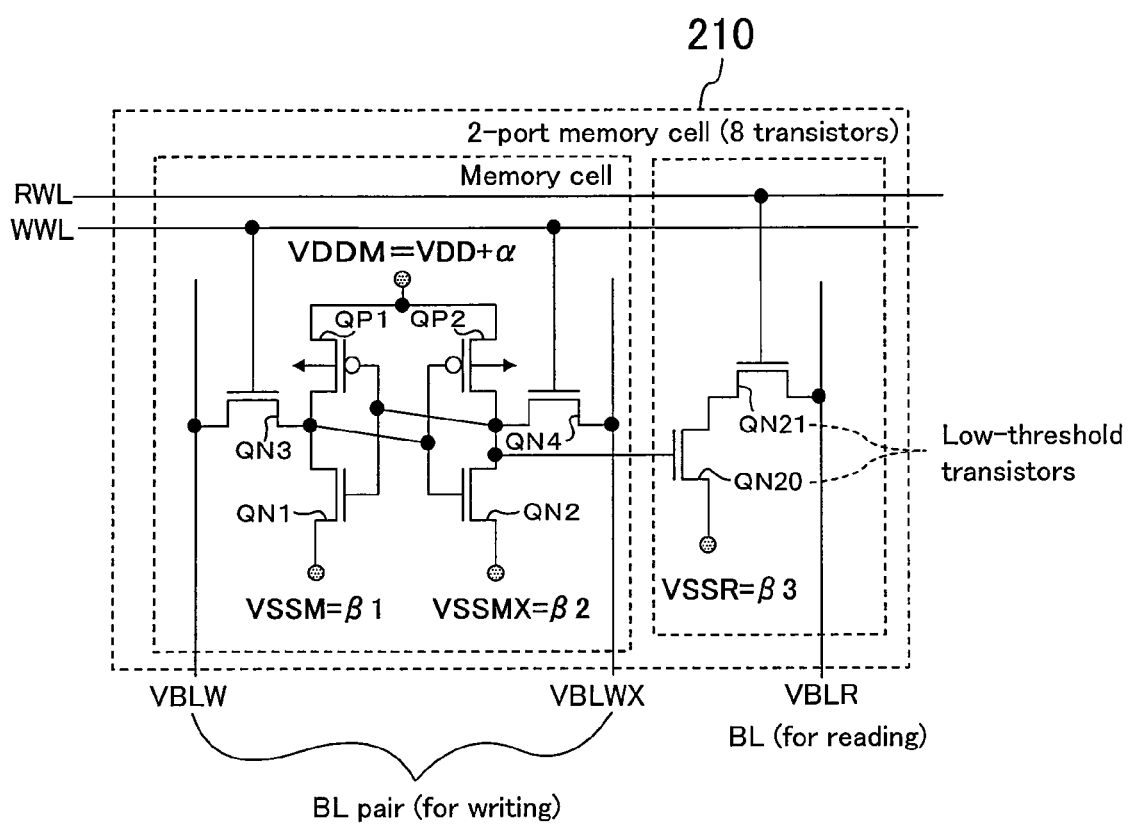
FIG. 5 shows an example of the structure of a 2-port memory cell.

Referring to FIG. 5, the memory cell 210 further includes N-type MOS transistors QN20 and QN21 (read transistors), and the drive transistors QN1 and QN2 are coupled to separate memory cell low-data holding power supplies, VSSM and VSSMX, respectively. In these respects also, the memory cell 210 is different from the memory cells 110.

As shown in FIG. 5, the N-type MOS transistor QN20 has a gate terminal connected to one of the data memory nodes of the memory cell 210. The source terminal of the transistor QN20 is connected to low-side power supply VSSR (specifically, an independent ground line) which is separate from the low-data holding power supply of the memory cell 210. The drain terminal of the transistor QN20 is connected to the drain terminal of the N-type MOS transistor QN21. The N-type MOS transistor QN21 has a gate terminal connected to a read word line (RWL) and a source terminal connected to a read bit line (RBL).

The threshold value of the N-type MOS transistors QN20 and QN21 is lower than the absolute values of the threshold values of the other transistors of the memory cell 210 (QN1 to QN4, QP1, and QP2). The N-type MOS transistors QN20 and QN21 have the same threshold value as that of logic transistors which are not included in the memory cell 210.

Each column has two low-data holding power supply controlling circuits 220, which provides memory cell low-data holding data power supplies VSSM1 (or VSSM2) and VSSMX1 (or VSSMX2). Specifically, the low-data holding power supply controlling circuit 220 includes a NAND circuit 221 having three inputs in place of the NAND circuit 141 of the low-data holding power supply controlling circuit 140.

The NAND circuit 221 receives write enable control signal WEN, column address signal (AD0 or AD1), and input data (either of DIN and DINX which are complementary to each other).

The semiconductor memory 200 includes write bit lines (WBL1 and WBL2), write word lines (WWL1 and WWL2), read bit lines (RBL1 and RBL2), and read word lines (RWL1 and RWL2), which are connected to the memory cell 210 as shown in FIG. 4.

For example, the read bit lines (RBL1 and RBL2) are connected to the drain of the N-type MOS transistor QN21 of the memory cell 210 in each column. The read word lines (RWL1 and RWL2) select the gate of the N-type MOS transistor QN21.

That is, in the semiconductor memory 200, a read/write control circuit (not shown) controls the write bit line as a port for writing and the read bit line as a port for writing, whereby read and write operations can be simultaneously performed.

In a write operation of the semiconductor memory 200 having the above-described structure, the low-data holding power supply controlling circuit 220 selects, in a selected column, memory cell low-data holding power supply on the side where high-data is written (VSSM or VSSMX) and renders the selected power supply high as compared with an unselected column (see FIG. 6). As a result, the switching potential of the inverter on the side where high-data is written becomes high. Therefore, writing in the memory cell becomes easier, and the write level is increased.

In this embodiment, memory cell low-data holding power supplies VSSM and VSSMX are separate from ground power supply VSSR used for reading. Therefore, even when a read or write operation is carried out in different memory cells on the same column or the same word line, the write level can be increased without deterioration in the read current.

The semiconductor memory 200 may control the potential on a column-by-column basis with a single low-data holding power supply controlling circuit 220 and by integration of memory cell low-data holding power supplies VSSM and VSSMX. In this case, the circuit can be simplified as compared with one including two low-data holding power supply controlling circuits 220, although the data writability can slightly deteriorate.

In writing of data in a selected cell, for example, the level supplied to the memory cell high-data holding power supply VDDM is used to maintain the potential of a selected read word line RWL1 (or RWL2) connected to power supply VWL (not shown) at a potential higher than potential VDD reached when the write word lines WWL1 and WWL2 are selected, whereby the cell current supplied through the N-type MOS transistors QN20 and QN21 can be increased. As a result, fast reading is enabled.

Further, as shown in FIG. 5, the threshold value of the N-type MOS transistors QN20 and QN21 are set lower than the absolute values of the threshold values of the other transistors of the memory cell 210. As a result, the cell current flowing in a memory cell reading operation can be large, and fast reading can be achieved.

According to this embodiment, the threshold value of the N-type MOS transistors QN20 and QN21 are equal to the same as that of logic transistors which are not included in the memory cell 210, although in a conventionally-employed SRAM the threshold value of transistors is set higher than that of logic transistors which are not included in a memory cell with a view to increasing the static noise margin. Thus, according to this embodiment, an ion injection mask for the logic transistors can be used without using a special ion injection mask, and the process cost can be decreased.

Embodiment 3

Figure 7:
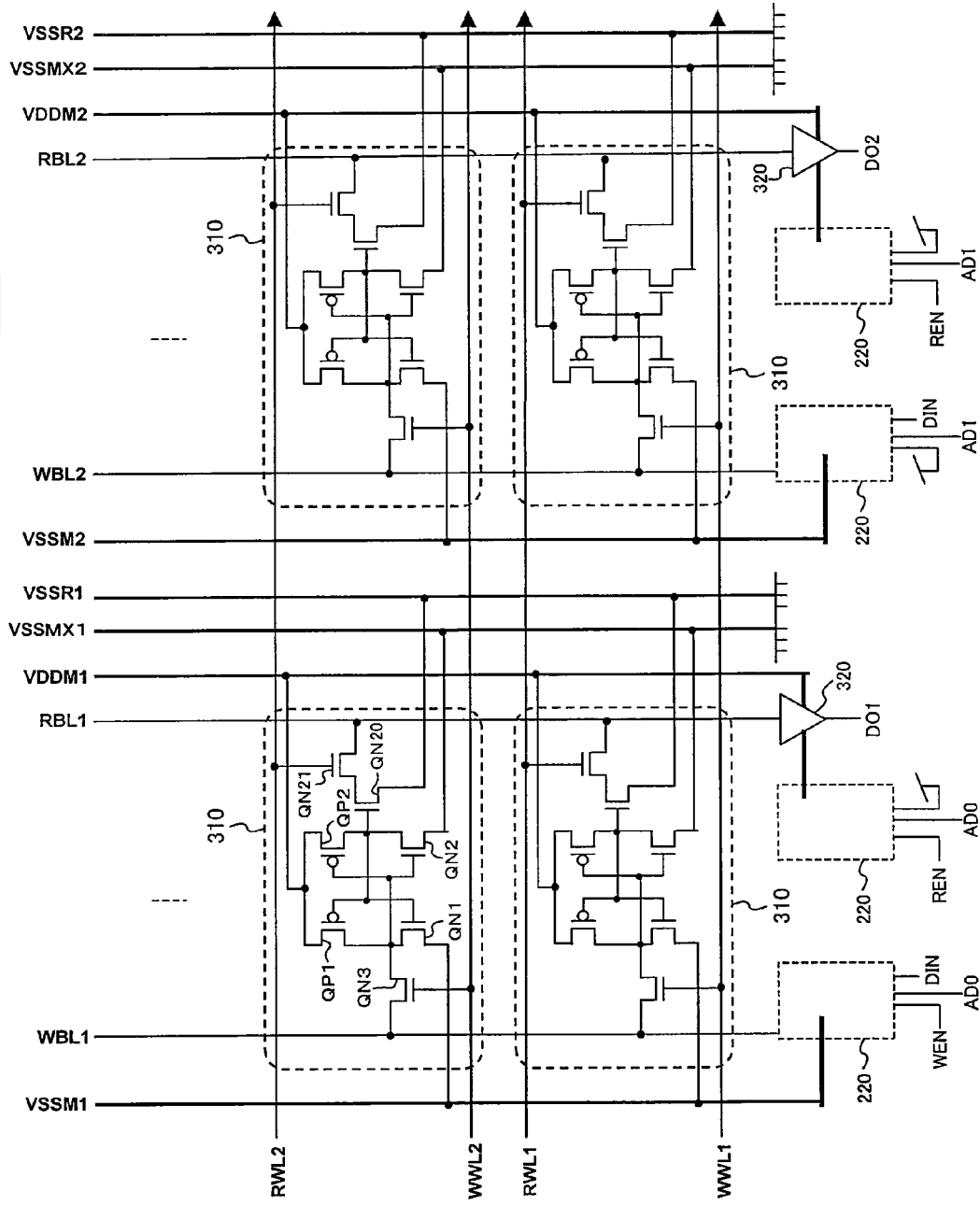
FIG. 7 is a block diagram showing the structure of a semiconductor memory according to embodiment 3.

FIG. 7 is a block diagram showing the structure of a semiconductor memory 300 according to embodiment 3 of the present invention. As shown in FIG. 7, the semiconductor memory 300 includes memory cells 310 in place of the memory cells 210 of the semiconductor memory 200 and further includes inverters 320.

Figure 8:
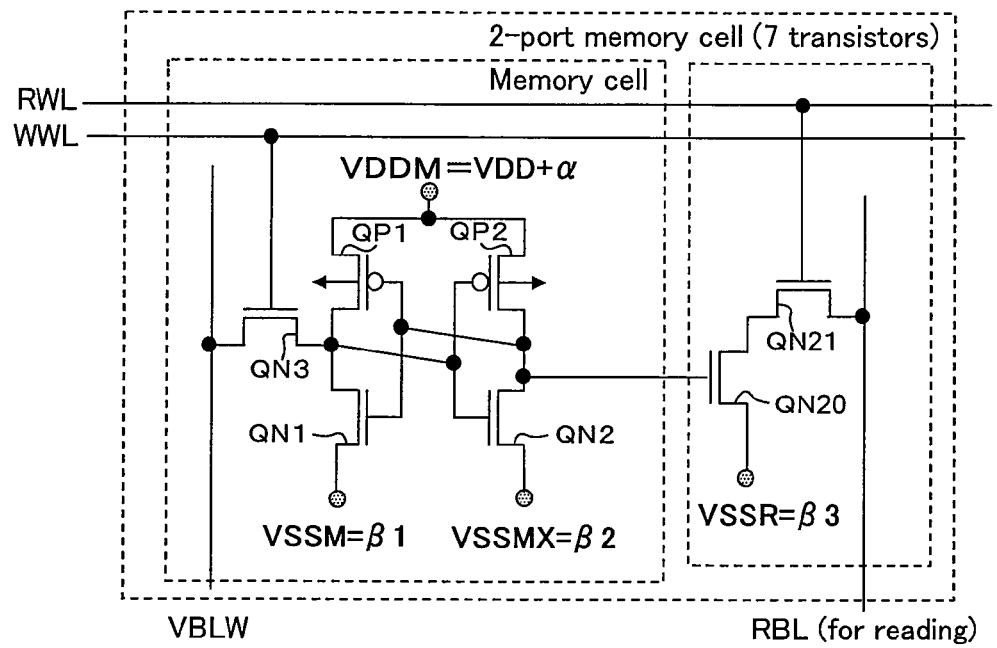
FIG. 8 shows an example of the structure of a 2-port memory cell.

Specifically, referring to FIG. 8, the memory cell 310 does not include the access transistor QN4 of the memory cell 210, and the write bit line is connected only to the access transistor QN3. That is, the number of write bit lines is smaller in the semiconductor memory 300 by one than in the semiconductor memory 200.

In FIG. 8, the current drivability of the access transistor QN3 is set larger than that of the drive transistors QN1 and QN2. For example, the current drivability may be set by setting the threshold value of the access transistor QN3 lower than that of the drive transistors QN1 and QN2. Alternatively, the setting may be realized by increasing the transistor width, or decreasing the transistor length, of the access transistor QN3.

The inverters 320 are used as amplifiers for reading of the read bit lines (RBL1 and RBL2). The inverter 320 is connected to the memory cell high-data holding power supply VDDM which is higher than precharge voltage VDD of the read bit lines (RBL1 and RBL2) and to memory cell low-data holding power supply VSSM which is higher than the ground potential. This arrangement achieves a high switching potential of the inverters as compared with a case where power supply VDD and ground potential are provided.

In FIG. 7, reference numeral REN denotes a read control signal. In a read operation, the low-data holding power supply controlling circuits 220 connected to the inverters 320 operate. The low-data holding power supply controlling circuits 220 connected to memory cell low-data holding power supply VSSM operate in a write operation.

In this embodiment also, the static noise margin, the write level, and the operation margin for a simultaneous read/write access in a 2-port operation can be increased as in embodiments 1 and 2. Further, since there is only one write bit line, the cell area can be small as compared with the semiconductor memory 200. Further, a larger space can be provided between the ground line and the power supply line in the same column, and accordingly, the noise interference between the lines can also be suppressed.

In this embodiment, the single write bit line (WBL) arrangement makes it difficult to write High potential in a memory cell as compared with a 2-bit line arrangement but, with a large current drivability of the access transistor QN3 (access transistor for writing), produces the effect of rendering it easy to write High potential in a memory cell through the write bit line WBL.

Since the switching potential of the inverter 320 is high, a potential drop in the read bit line RBL precharged to VDD level is quickly detected in a read operation, so that reading can be quickly carried out.

In the semiconductor memory 300, only power supply VSSM of the drive transistor QN1 is controlled while power supplies VSSMX and VSSR are coupled to the ground line. However, power supplies VSSM, VSSMX and VSSR may be separately controlled.

The gate terminal of the N-type MOS transistor QN20 may be connected to any memory node of a flip flop circuit in a memory cell.

Embodiment 4

In embodiment 4, an example of the memory cell layout over a semiconductor chip is described.

Figure 9:
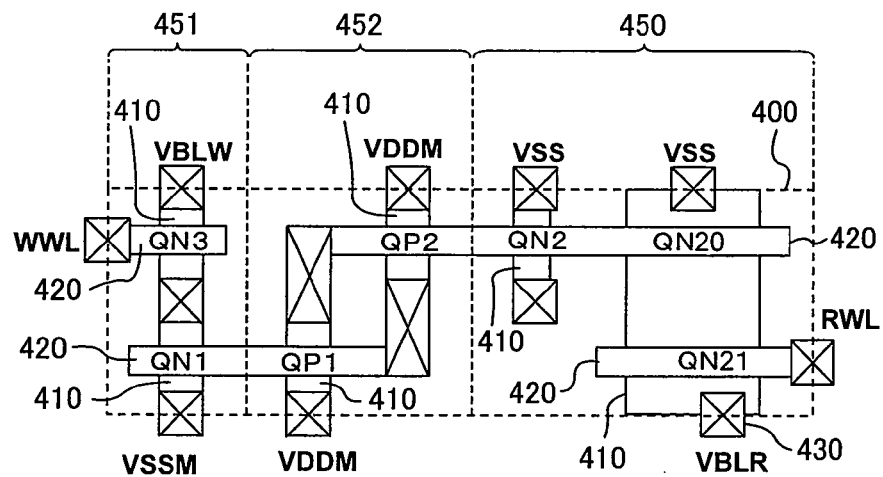
FIG. 9 shows an example of the layout over a semiconductor chip of the 2-port memory cell of embodiment 3.

FIG. 9 shows an example of the layout over a semiconductor chip of the memory cells 310 of embodiment 3. In FIG. 9, reference numeral 410 denotes a diffusion layer, reference numeral 420 denotes a gate wire, and reference numeral 430 denotes a contact. The memory cell 400 includes P-type well regions 450 and 451 and an N-type well region 452. These regions include drive transistors QN1 to QN3 (N-type transistors), N-type MOS transistors QN20 and QN21, and load transistors QP1 and QP2 (P-type transistors). Although this semiconductor chip actually has an overlying metal layer connected to the contact 430, this layer is not shown in FIG. 9 in order to illustrate the structural features of the diffusion layer 410 and the gate wire 420 in this embodiment.

As shown in FIG. 9, the diffusion layer 410 and the gate wire 420 are linearly aligned in the column and row directions. This arrangement generates only small refraction and small surface irregularities and is therefore suitable to microprocessing. That is, it is possible to achieve an efficient layout of the transistors.

The linear alignment of the diffusion layer 410 and the gate wire 420 in the column and row directions enables such a layout that the N-type MOS transistors QN20 and QN21 (read transistors) are separate from the transistors which constitute the primary part of the memory cell (load transistors QP1 and QP2, drive transistors QN1 and QN2, and access transistors QN3 and QN4). This layout enables the size of the read transistors to be larger than the transistors constituting the primary part of the memory cell. The large reading transistor size enables a large read current, and accordingly, the reading speed can be increased.

Separation of the transistors constituting the primary part of the memory cell from the read bit line results in a large margin for noise. Although the primary part of the memory cell can have a large noise margin by setting the threshold voltage of the transistors constituting the primary part of the memory cell to be higher than that of transistors of peripheral logic circuits (not shown), this embodiment has a large margin for noise without increasing the threshold voltage so that the threshold voltage of the transistors constituting the primary part of the memory cell can be equal to or lower than that of the other transistors.

To form transistors having different threshold voltages on one semiconductor chip, a plurality of ion injection masks are necessary for setting the different thresholds. In this embodiment, the threshold voltage of the transistors constituting the primary part of the memory cell can be equal to that of the other transistors as described above, the number of mask types can be decreased, and accordingly, the production cost can be reduced.

The cell current for driving the read bit line can be increased by setting the threshold value of the N-type MOS transistors QN20 and QN21 (read transistors) to be lower than that of the other transistors of the memory cell, for example, to be equal to that of logic transistors outside the SRAM. Further, the same ion injection mask as that used for the logic transistors can be used to decrease the production cost.

By setting the threshold value of the N-type MOS transistors QN20 and QN21 and drive transistor QN2 (N-type transistor) on the P-well region shown in FIG. 9 to be equal to that of the logic transistors outside the SRAM, the threshold value of the drive transistor QN2 is decreased, rendering it easy to write High level in the memory cell.

Embodiment 5

Figure 10:
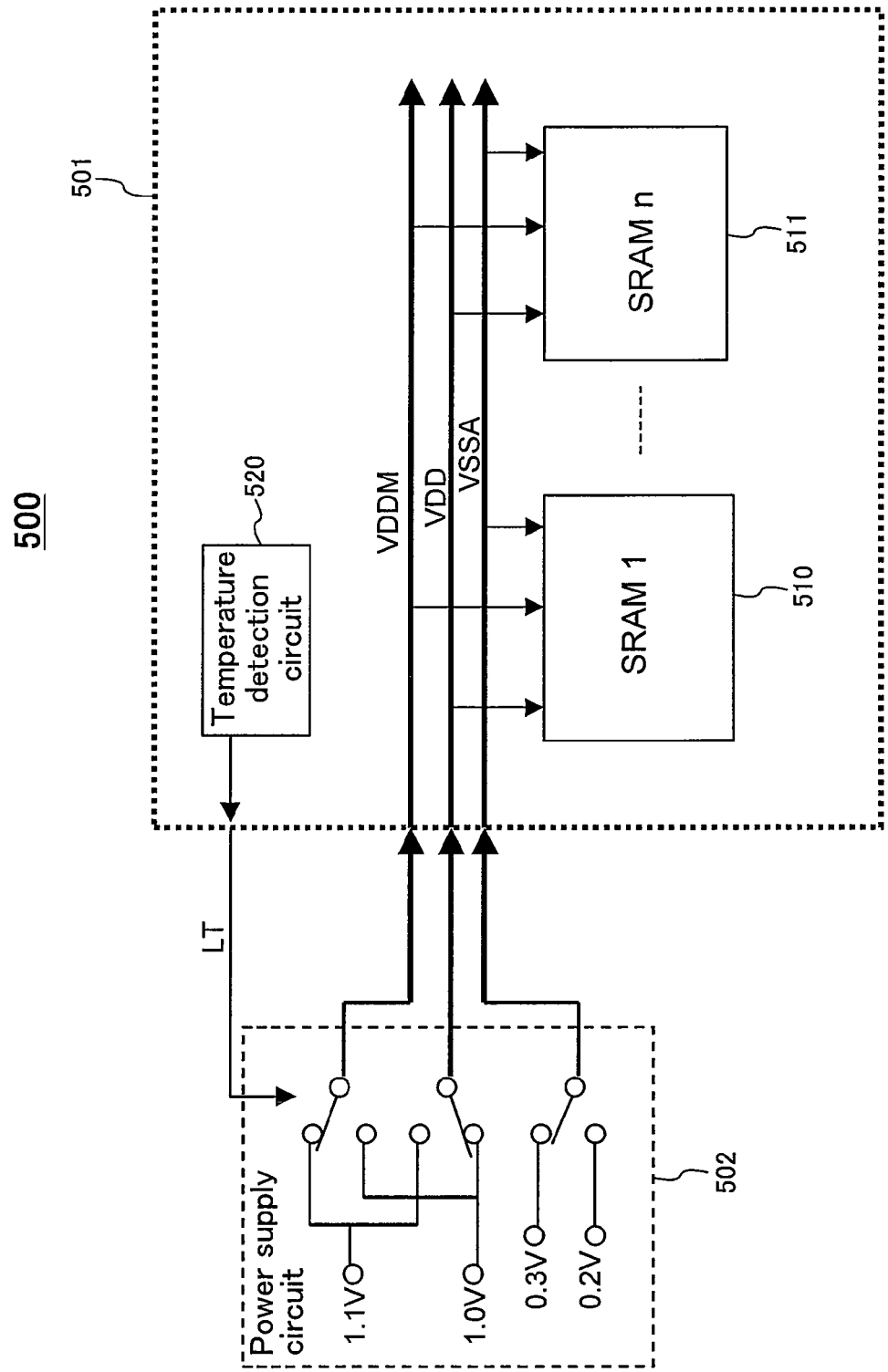
FIG. 10 is a block diagram showing the structure of a semiconductor memory according to embodiment 5.

FIG. 10 is a block diagram showing an example of the structure of a semiconductor memory device 500 according to embodiment 5 of the present invention. The semiconductor memory device 500 includes an LSI chip 501 and a power supply circuit 502 as shown in FIG. 10.

The LSI chip 501 includes a plurality of SRAMs (in this example, SRAMs 510 and 511) and a temperature detection circuit 520.

Figure 11:
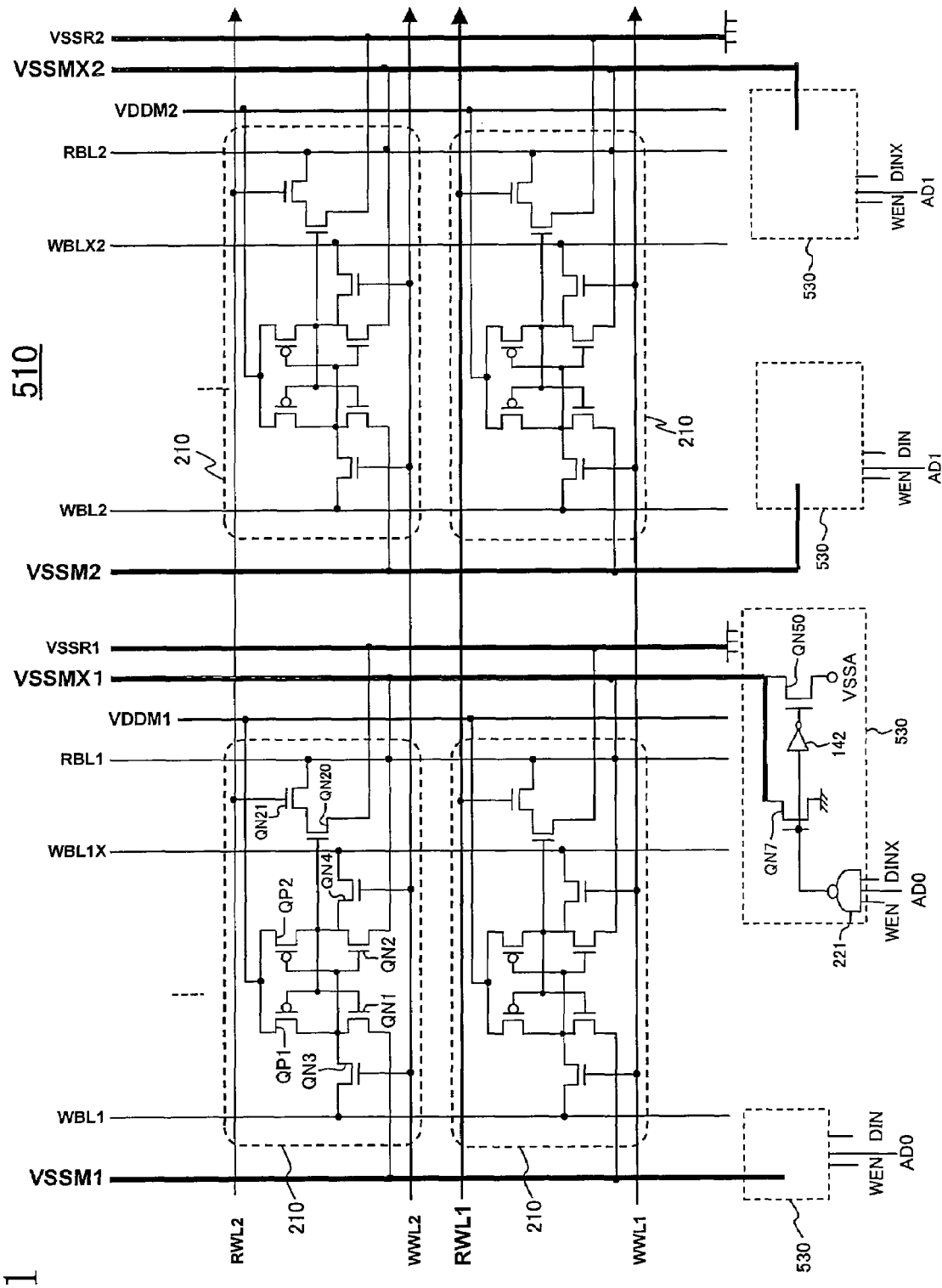
FIG. 11 is a block diagram showing the internal structure of an SRAM in the semiconductor memory of embodiment 5.

The SRAMs 510 and 511 may be any of the semiconductor memories 100, 200, and 300 of embodiments 1 to 3. Although the structure of the memory cell matrix is not limited to anything particular, an example described in this embodiment uses an SRAM 510 which is a variation of the semiconductor memory 200. FIG. 11 shows the internal structure of the SRAM 510. The SRAM 510 includes low-data holding power supply controlling circuits 530 in place of the low-data holding power supply controlling circuits 220 of the semiconductor memory 200.

The low-data holding power supply controlling circuit 530 includes a NOT circuit 142, a NAND circuit 221, an N-type MOS transistor QN7, and an N-type MOS transistor QN50. In the low-data holding power supply controlling circuits 530, the output of NAND circuit 221 is connected to the gate of the N-type MOS transistor QN50 through the NOT circuit 142. The source of the N-type MOS transistor QN50 is connected to power supply VSSA (described later). The drain of the N-type MOS transistor QN50 is connected to the low-data holding power supply line VSSM or VSSMX. With this arrangement, in a write operation in a selected column, the power supply VSSA is provided as the memory cell low-data holding power supply on the side where high-data is written (VSSM or VSSMX).

The temperature detection circuit 520 is provided in the vicinity of the SRAMs 510 and 511 on the LSI chip 501. The temperature detection circuit 520 detects the operation temperature of the SRAMs 510 and 511 to output a signal according to the detected temperature. Specifically, if the detected operation temperature of the SRAMs 510 and 511 is equal to or lower than a predetermined reference temperature, the temperature detection circuit 520 outputs low temperature detection signal LT which is set at High level. If the detected operation temperature of the SRAMs 510 and 511 is higher than the reference temperature, the temperature detection circuit 520 outputs low temperature detection signal LT which is set at Low level. Herein, the reference temperature is between the upper and lower limits of the operation temperature requirement (operable temperature) of the SRAMs 510 and 511. For example, where the upper and lower limits of the operation temperature of the SRAMs 510 and 511 are 125° C. and −40° C., respectively, and the reference temperature is 27° C., the temperature detection circuit 520 switches the state of low temperature detection signal LT at 27° C. Specifically, the temperature detection circuit 520 may be, for example, a temperature detection circuit described in 1993 *Symposium on VLSI Circuits*, pp. 43-44.

The power supply circuit 502 is powered by an unshown power source to set the power supplies VDDM, VDD and VSSA for the SRAMs 510 and 511 (for SRAMs) according to low temperature detection signal LT output by the temperature detection circuit 520. Specifically, as shown in FIG. 12, if low temperature detection signal LT is at High level, the power supplies VDDM, VDD and VSSA are at 1.0 V, 1.1 V, and 0.3 V, respectively. If low temperature detection signal LT is at Low level, the power supplies VDDM, VDD and VSSA are at 1.1 V, 1.0 V, and 0.2 V, respectively. The power supplies VDDM, VDD and VSSA for SRAMs are used as high-data holding power supply VDDM to the memory cells of the SRAMs 510 and 511, a power supply to unshown drivers of the word lines WWL and RWL, and low-data holding power supplies VSSM and VSSMX to the memory cells, respectively.

When the semiconductor memory device 500 operates so that the temperature detection circuit 520 detects that, for example, the temperature around the SRAMs 510 and 511 is higher than a predetermined temperature (in this example, 27° C.), low temperature detection signal LT becomes Low level. Thus, referring to FIG. 12, the power supplies VDDM, VDD and VSSA for SRAMs which are provided by the power supply circuit 502 are at 1.1 V, 1.0 V, and 0.2 V, respectively.

Although the operations of the SRAM 510 are the same as those of the semiconductor memory 200 of embodiment 2, the low-data holding power supply controlling circuits 530 provides VSSA as the memory cell low-data holding power supply on the side where high-data is written (VSSM or VSSMX) in a selected column in a write operation.

When the temperature detection circuit 520 detects that the temperature around the SRAMs 510 and 511 is lower than 27° C., low temperature detection signal LT becomes High level. Accordingly, the power supply circuit 502 changes the potentials of the power supplies VDDM, VDD and VSSA for SRAMs to 1.0 V, 1.1 V, and 0.3 V, respectively. As a result, in the SRAMs 510 and 511, the potential of the memory cell high-data holding power supply VDDM is lower than that set at the time of a high temperature (a temperature higher than the predetermined temperature), the potentials of the selected write word line WWL and selected read word line RWL are higher than those set at the time of a high temperature, and the potential of the low-data holding power supply VSSA is higher than that set at the time of a high temperature.

In the semiconductor memory device 500 having the above-described structure, the following practical effects can be achieved.

In general, the static noise margin of a flip flop of 2-inverter cross-coupled structure, which may be used in such memory cells as one-port SRAMs and two-port SRAMs increases as the temperature decreases. This is because the threshold value of the transistor increases when the temperature is low. Conversely, the value of the write level decreases as the temperature decreases, so that writing in a memory cell becomes difficult.

Thus, in the semiconductor memory device 500 of embodiment 5, when the temperature is lower than the predetermined temperature, the potential of the memory cell high-data holding power supply VDDM is set low as compared with the case of a high temperature, whereby writing of data in memory cells becomes easier while the static noise margin of the memory cells is secured.

At the time of a low temperature, potential VDD of the selected write word line WWL is set high as compared with the case of a high temperature, whereby writing of data in memory cells becomes easier while the static noise margin of the memory cells is secured.

At the time of a low temperature, the potential of the memory cell low-data holding power supply VSSM or VSSMX is set high as compared with the case of a high temperature, whereby the switching level of the memory cells is increased while the static noise margin of the memory cells is secured, so that writing of data in memory cells becomes easier.

In embodiment 5, the low data holding power supply of the memory cell is divided into VSSM and VSSMX in each column. However, even when the equal potentials are supplied as VSSM and VSSMX at the same time, writing of data in the memory cell becomes easier although some difference occurs in the effect. Further, the number of low-data holding power supply control circuits is halved so that the circuit area is reduced.

Further, even when VSSA level is supplied all the time without passing through a low-data holding power supply control circuit, writing of data in the memory cell becomes easier although some difference occurs in the effect. In this case, the low-data holding power supply control circuit can be omitted so that the circuit area is reduced.

Embodiment 6

Figure 13:
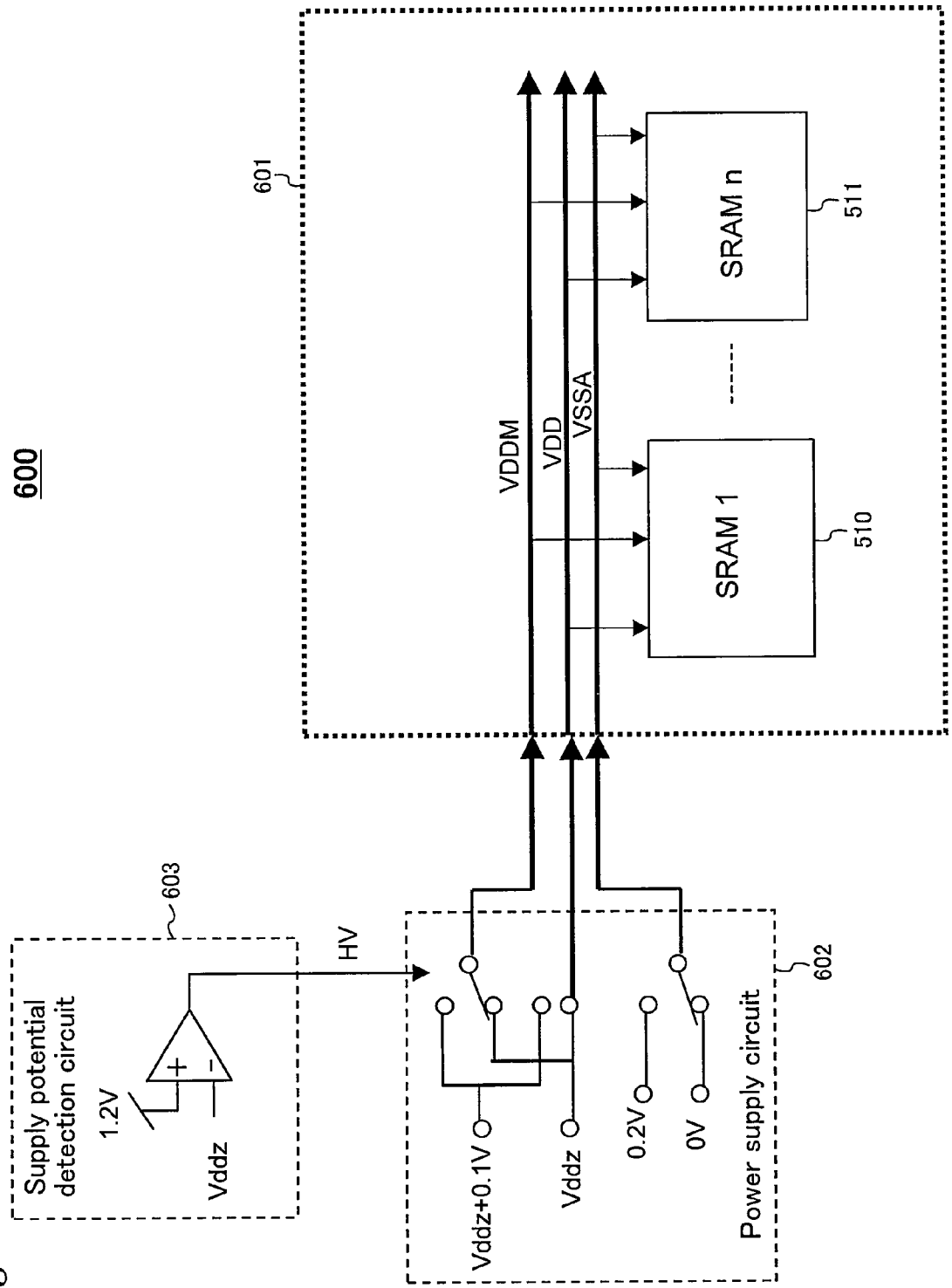
FIG. 13 is a block diagram showing the internal structure of an SRAM in the semiconductor memory of embodiment 6.
Figure 15:
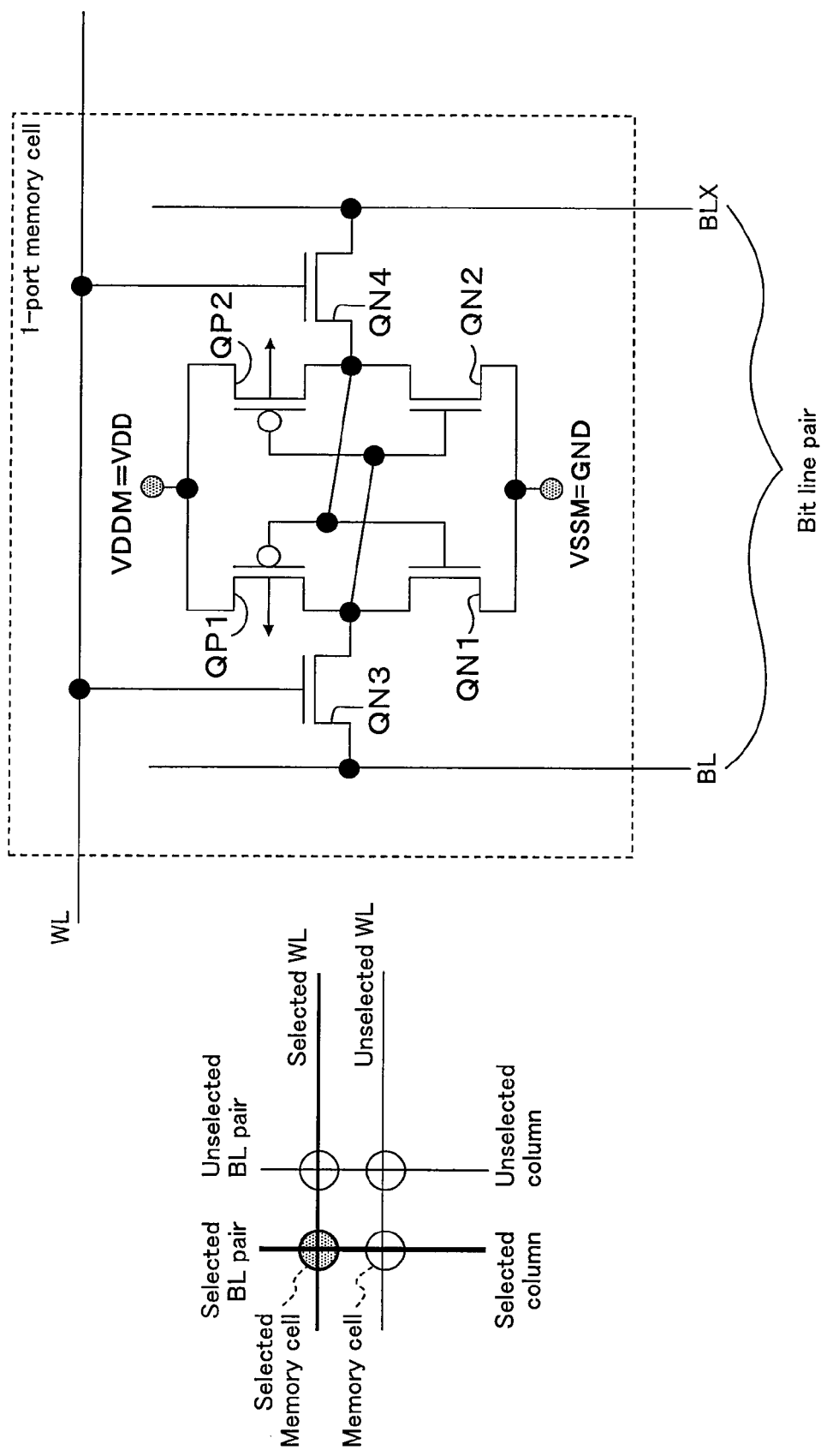
FIG. 15 shows the structure of a 1-port SRAM of a common flip flop type.
Figure 16:
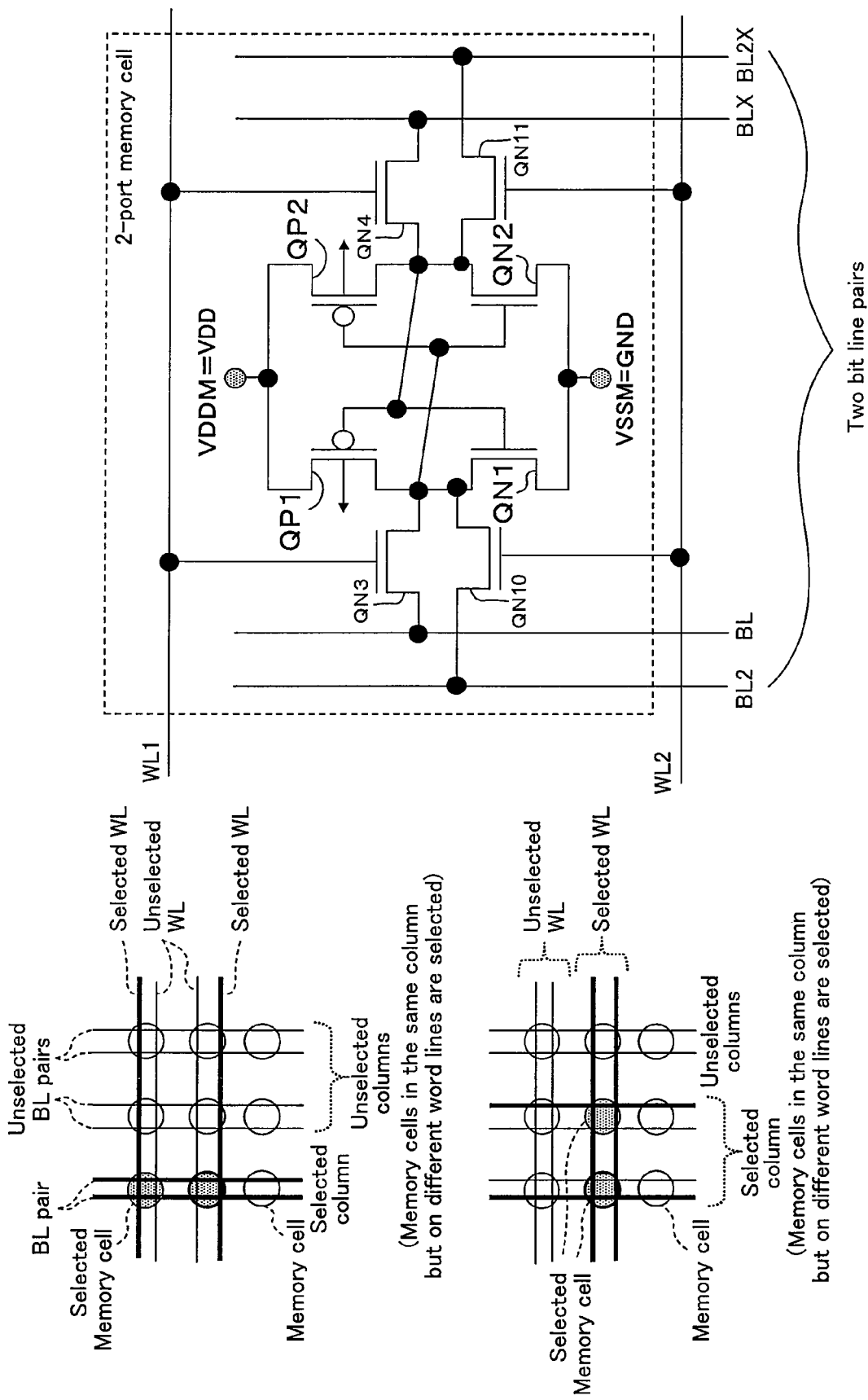
FIG. 16 shows the structure of a commonly-employed 2-port SRAM.

FIG. 13 is a block diagram showing an example of the structure of a semiconductor memory 600 according to embodiment 6 of the present invention. The semiconductor memory 600 includes an LSI chip 601, a power supply circuit 602, and a supply potential detection circuit 603 as shown in FIG. 13.

The LSI chip 601 includes a plurality of SRAMs (in this example, SRAMs 510 and 511).

The power supply circuit 602 is powered by an unshown power source to set the power supplies VDDM, VDD and VSSA for the SRAMs according to high voltage detection signal HV (described later) output by the supply potential detection circuit 603. Specifically, as shown in the lower table of FIG. 14, if high voltage detection signal HV is at High level, the power supplies VDDM, VDD and VSSA for SRAMs are at 1.3 V, 1.3 V, and 0.0 V, respectively. If high voltage detection signal HV is at Low level, the power supplies VDDM, VDD and VSSA for SRAMs are at 1.1 V, 1.0 V, and 0.2 V, respectively, as shown in the upper table of FIG. 14. The power supplies VDDM, VDD and VSSA for SRAMs are used as high-data holding power supply VDDM to the memory cells of the SRAMs 510 and 511, a power supply to unshown drivers of the word lines WWL and RWL, and low-data holding power supplies VSSM and VSSMX to the memory cells, respectively, as in the semiconductor memory device 500.

The supply potential detection circuit 603 detects the potential of the power supply Vddz for SRAMs, which is supplied from an unshown power source to the power supply circuit 602, and outputs a signal (high voltage detection signal HV) determined according to the detected potential. Specifically, if the potential of the power supply Vddz detected by the supply potential detection circuit 603 is equal to or higher than a predetermined potential, the supply potential detection circuit 603 sets high voltage detection signal HV to High level. If the potential of the power supply Vddz is lower than a predetermined potential, the supply potential detection circuit 603 sets high voltage detection signal HV to Low level. Herein, the predetermined potential is between the upper and lower limits of the supply voltage operation condition of the SRAMs 510 and 511 (the supply voltage at which the SRAMs 510 and 511 are operable). For example, where the upper limit potential is 1.5 V, the lower limit potential is 0.8 V, and the predetermined potential is 1.2 V, the supply potential detection circuit 603 switches the state of high voltage detection signal HV at 1.2 V.

When the semiconductor memory 600 operates and the supply potential detection circuit 603 detects that the power supply Vddz has a potential lower than 1.2 V, for example, Vddz=1.0 V, high voltage detection signal HV becomes Low level. Accordingly, the power supply circuit 602 switches the potentials of the power supplies VDDM, VDD and VSSA for SRAMs to 1.1 V, 1.0 V, and 0.2 V, respectively, as shown in the upper table of FIG. 14. The power supply method to the inside of the SRAMs is the same as that of the example described in embodiment 5.

When the supply potential detection circuit 603 detects that the power supply Vddz has a potential higher than 1.2 V, for example, Vddz=1.3 V, high voltage detection signal HV becomes High level. Accordingly, the power supply circuit 602 switches the potentials of the power supplies for SRAMs, VDDM, VDD, and VSSA, to 1.3 V, 1.3 V, and 0.0V, respectively, as shown in the lower table of FIG. 14.

Thus, when Vddz is higher than 1.2 V, the potential of the memory cell high-data holding power supply VDDM decreases from Vddz+0.1 V to Vddz. In such a way, the potential of the selected read word line RWL decreases from Vddz+0.1 V to Vddz. The potential of memory cell low data holding power supply VSSA decreases from 0.2 V to 0.0 V.

In the semiconductor memory device 600 having the above-described structure, the following practical effects can be achieved.

In general, the static noise margin, and the write margin represented by the write level, of a flip flop of 2-inverter cross-coupled structure, which may be used in such memory cells as one-port SRAMs and two-port SRAMs, both increase as the supply voltage increases. That is, in the case of a high supply voltage, reading of data and writing of data are easy as compared with the case of a low supply voltage.

Thus, in the power supply control with a view to expanding the static noise margin and write margin of the memory cells, the strictness of the control can be relaxed when the supply voltage is higher than a predetermined potential. This enables to prevent deterioration in transistor reliability which would occur due to excessive supply of a high potential at the time of a high voltage, and to prevent increase in power.

Specifically, as in the structure of embodiment 6, at the time of a high supply voltage, the potential of the memory cell high-data holding power supply VDDM is set low as compared with the case of a low supply voltage, whereby the power consumption in the memory cells is reduced while both the margins for memory cell reading and writing are maintained. Further, the gate-source potential of a memory cell transistor is decreased so that the electric field on an insulator film of the transistor is relaxed. As a result, the reliability of the transistor is improved.

At the time of a high supply voltage, the potential of the selected read word line RWL is set low as compared with the case of a low supply voltage, whereby the power consumed when the word line drives a load is reduced while both the margins for memory cell reading and writing are maintained.

The electric field on a gate insulator film of an access transistor of a memory cell is relaxed, so that the reliability of the transistor is improved.

At the time of a high supply voltage, the potentials of the memory cell low-data holding power supplies VSSM and VSSMX are set low as compared with the case of a low supply voltage, whereby the power consumed by driving the power supplies VSSM and VSSMX in a selected column is reduced while both the margins for memory cell reading and writing are maintained.

By decreasing the potential of the memory cell high-data holding power supply VDDM at the time of a high supply voltage and using the same power supply as a power supply VDD for a selected word line as in embodiment 6, the number of power supplies is reduced so that the circuit structure is simplified.

The circuit structure can also be simplified by sharing the selected word line power supply VDD with logic circuits other than SRAMs as a logic power supply at the time of a high supply voltage.

The circuit structure can also be simplified by using the potentials of the memory cell low-data holding power supplies VSSM and VSSMX of a selected column commonly for ground potential (0 V) used for the memory cell low-data holding power supply of an unselected column.

Various combinations of the above-described elements of the present invention are possible within a logically-possible range. For example, various combinations of potential values may be applied to the structures described above in embodiments 1 to 6 (the structures shown in FIG. 1, FIG. 4, FIG. 7, FIG. 10 to FIG. 12, FIG. 13, and FIG. 14).

Thus, the present invention achieves both improvement in static noise margin and improvement in write level in a semiconductor memory including flip flop type memory cells, such as 1-port SRAM or 2-port SRAM in which read and write operations are simultaneously carried out, thereby producing the effect of realizing a semiconductor memory which has stable memory cell characteristics. Therefore, the present invention is useful for a semiconductor memory including flip flop type memory cells.

What is claimed is:

1. A semiconductor memory, comprising:
   a plurality of word lines;
   a plurality of bit lines;
   a plurality of memory cells, each connected to at least one of the plurality of word lines and at least one of the plurality of bit lines, and including two cross-coupled inverter circuits for holding a pair of high data and low data; and
   a low-data holding power supply control circuit for controlling a potential of a low-data holding power supply coupled to the plurality of memory cells,
   wherein the low-data holding power supply control circuit controls, in a write operation, a potential of a low-data holding power supply of at least one of the plurality of memory cells which is selected for the write operation to be higher than a potential of a low-data holding power supply of at least one of the plurality of memory cells when not in a writing operation.

2. The semiconductor memory of claim 1, wherein:
   each of the two inverter circuits includes a low-data holding transistor and a high-data holding transistor which are connected in series; and
   a potential supplied to the high-data holding transistor is higher than a potential of the at least one of the plurality of word lines at a time of being selected.

3. The semiconductor memory of claim 1,
   each of the two inverter circuits includes a low-data holding transistor and a high-data holding transistor which are connected in series; and
   a potential of the plurality of bit lines is precharged at level lower than a potential of the plurality of word lines at a time of being selected.

4. The semiconductor memory of claim 2, wherein a difference between the precharge potential for the plurality of bit lines and a potential of the plurality of word lines at the time of being selected is equal to or smaller than a threshold voltage of transistors of the plurality of memory cells.

5. The semiconductor memory of claim 1, wherein each memory cell is connected to a first word line and a second word line, and further includes a first access transistor connected to the first word line and a second access transistor connected to the second word line.

6. The semiconductor memory of claim 1, wherein:
   each memory cell further includes a first read transistor and a second read transistor;
   the plurality of bit lines include read bit lines and write bit lines;
   the plurality of word lines include read word lines and write word lines;
   the first read transistor has a gate terminal connected to one of data memory nodes of each memory cell and a source terminal supplied with a potential of a low-data holding power supply or high-data holding power supply of each memory cell; and
   the second read transistor has a gate terminal connected to a read word line, a source terminal connected to a read bit line, and a drain terminal connected to a drain terminal of the first read transistor.

7. The semiconductor memory of claim 6, wherein:
   each of the two inverter circuits includes a low-data holding transistor and a high-data holding transistor which are connected in series; and
   source terminals of the low-data holding transistors of the two inverter circuits are connected to different low-data holding power supplies.

8. The semiconductor memory of claim 6, wherein source terminals of the low-data holding transistors of the two inverter circuits and a source terminal of the first read transistor are connected to different low-data holding power supplies.

9. The semiconductor memory of claim 7, wherein the low-data holding power supplies connected to the source terminals of the low-data holding transistors of the two inverter circuits are controlled to have different potentials according to input data in the low-data holding power supply control circuit.

10. The semiconductor memory of claim 6, wherein a potential of the read word line connected to the gate terminal of the second read transistor at a time of being selected is higher than a potential of a write word line at a time of being selected.

11. The semiconductor memory of claim 6, wherein:
   each memory cell further includes an access transistor and is connected to one write bit line; and
   the access transistor has a source terminal connected to one of the data memory nodes of each memory cell, a gate terminal connected to a write word line, and a drain terminal connected to the write bit line.

12. The semiconductor memory of claim 11, wherein the gate terminal of the first read transistor is connected to one of the data memory nodes of each memory cell which is different from the data memory node connected to the source terminal of the access transistor.

13. The semiconductor memory of claim 11, wherein:
source terminals of the low-data holding transistors of the two inverter circuits are connected to different low-data holding power supplies; and
when data at high level is written in the write bit line, a potential of a source terminal of a low-data holding transistor of one of the two inverter circuits of which output is connected to the data memory node connected to the access transistor is controlled to be higher than a potential of a source terminal of a low-data holding transistor of the other inverter circuit.

14. The semiconductor memory of claim 6, further comprising:
an access transistor which has a source terminal connected to the data memory node, a gate terminal connected to a write word line, and a drain terminal connected to a write bit line; and
a control circuit for controlling the access transistor and the second read transistor as a write port and a read port, respectively, to simultaneously perform a read operation on one of two of the plurality of memory cells and a write operation on the other one of the two memory cells.

15. The semiconductor memory of claim 11, wherein the first and second read transistors are formed by a diffusion layer having a linear shape, the diffusion layer being parallel to a diffusion layer of transistors of the inverter circuits.

16. The semiconductor memory of claim 6, wherein the threshold value of the first and second read transistors is equal to that of a transistor of a logic circuit other than transistors used for the plurality of memory cells.

17. A semiconductor memory, comprising:
a plurality of word lines;
a plurality of bit lines;
a plurality of memory cells, each connected to at least one of the plurality of word lines and at least one of the plurality of bit lines and including two cross-coupled inverter circuits for holding a pair of high data and low data; and
a low-data holding power supply control circuit for controlling a potential of a low-data holding power supply coupled to the plurality of memory cells,
wherein the low-data holding power supply control circuit includes a first transistor connected to a first power supply and a second transistor connected to a second power supply, and supplies a potential between the first and second power supplies to the low-data holding power supply line in a write operation.

18. A semiconductor memory, comprising:
a memory cell connected to at least one word line and at least one bit line, and including two cross-coupled inverter circuits for holding a pair of high data and low data; and
a low-data holding power supply control circuit for controlling a potential of a low-data holding power supply coupled to the memory cell,
wherein the low-data holding power supply control circuit controls a potential of the low-data holding power supply of the memory cell in a write operation to be higher than a potential of the low-data holding power supply of the memory cell when not in a writing operation.

19. The semiconductor memory of claim 18, wherein:
each of the two inverter circuits includes a low-data holding transistor and a high-data holding transistor which are connected in series; and
a potential supplied to the high-data holding transistor is higher than a potential of the word line at the time of being selected.

20. The semiconductor memory of claim 18, wherein:
each of the two inverter circuits includes a low-data holding transistor and a high-data holding transistor which are connected in series; and
a potential of the bit line is precharged at level lower than a potential of the word line at a time of being selected.

* * * * *